United States Patent
Saito et al.

(10) Patent No.: US 12,154,760 B2
(45) Date of Patent: Nov. 26, 2024

(54) INDUCTIVELY-COUPLED PLASMA PROCESSING APPARATUS

(71) Applicant: TOKYO ELECTRON LIMITED, Tokyo (JP)

(72) Inventors: Hitoshi Saito, Nirasaki (JP); Kazuo Sasaki, Nirasaki (JP); Tsutomu Satoyoshi, Nirasaki (JP); Toshihiro Tojo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 656 days.

(21) Appl. No.: 16/737,068

(22) Filed: Jan. 8, 2020

(65) Prior Publication Data
US 2020/0227236 A1 Jul. 16, 2020

(30) Foreign Application Priority Data
Jan. 10, 2019 (JP) ................. 2019-002703

(51) Int. Cl.
*H01L 21/306* (2006.01)
*H01J 37/32* (2006.01)
(Continued)

(52) U.S. Cl.
CPC ......... *H01J 37/3211* (2013.01); *H01J 37/321* (2013.01); *H01J 37/32119* (2013.01);
(Continued)

(58) Field of Classification Search
CPC .......... H01J 37/32623; H01J 37/32633; H01J 37/32651; H01J 37/321; H01J 37/3211; H01J 37/32119
See application file for complete search history.

(56) References Cited

U.S. PATENT DOCUMENTS 5,571,366 A * 11/1996 Ishii ................ H01J 37/3299
216/60
5,683,548 A * 11/1997 Hartig .............. H01J 37/321
438/711
(Continued)

FOREIGN PATENT DOCUMENTS

CN 1477678 A 2/2004
CN 108987234 A 12/2018
(Continued)

*Primary Examiner* — Luz L Alejandro Mulero
(74) *Attorney, Agent, or Firm* — Nath, Goldberg & Meyer; Jerald L. Meyer; Tanya E. Harkins

(57) ABSTRACT

An inductively-coupled plasma processing apparatus for performing an inductively-coupled plasma processing on a rectangular substrate, includes: a processing container; a mounting table for mounting the substrate thereon; a rectangular metal window provided to be electrically insulated from the processing container while facing the mounting table; and an antenna unit for generating an inductively-coupled plasma inside the processing container. The metal window is divided into divided regions electrically insulated from each other by a first division extending in a radial direction toward each corner portion of the metal window. The antenna unit includes a first high-frequency antenna in which antenna segments having planar portions facing an upper surface of the metal window are arranged. Each antenna segment is configured by spirally winding an antenna wire in a vertical direction orthogonal to the upper surface of the rectangular metal window so that a winding axis is parallel to the upper surface.

12 Claims, 26 Drawing Sheets

(51) Int. Cl.
*H01Q 1/26* (2006.01)
*H01Q 9/04* (2006.01)
*H01Q 21/06* (2006.01)
*H01Q 1/22* (2006.01)

(52) U.S. Cl.
CPC ............. *H01Q 1/26* (2013.01); *H01Q 9/0464* (2013.01); *H01Q 21/065* (2013.01); *H01Q 1/2216* (2013.01)

(56) References Cited

U.S. PATENT DOCUMENTS

| | | | | |
|---|---|---|---|---|
| 6,036,878 | A * | 3/2000 | Collins | H01J 37/32458 216/68 |
| 6,051,073 | A * | 4/2000 | Chu | H01J 37/321 118/723 MP |
| 6,095,084 | A * | 8/2000 | Shamouilian | H01J 37/321 156/345.47 |
| 6,331,754 | B1 * | 12/2001 | Satoyoshi | H01J 37/321 315/111.51 |
| 8,597,463 | B2 * | 12/2013 | Sasaki | C23C 16/505 118/723 AN |
| 9,543,121 | B2 * | 1/2017 | Sasaki | H01J 37/32119 |
| 2002/0153349 | A1 * | 10/2002 | Okumura | H01J 37/321 117/108 |
| 2010/0175831 | A1 * | 7/2010 | Sasaki | C23C 16/505 156/345.48 |
| 2010/0244699 | A1 * | 9/2010 | Dine | H01J 37/32091 315/111.51 |
| 2012/0267051 | A1 * | 10/2012 | Sasaki | H01J 37/3211 156/345.48 |
| 2013/0200043 | A1 * | 8/2013 | Tojo | H05H 1/46 216/68 |
| 2017/0372910 | A1 * | 12/2017 | Tanaka | H01L 21/3065 |
| 2018/0254191 | A1 * | 9/2018 | Ohtake | H01J 37/321 |
| 2018/0286641 | A1 * | 10/2018 | Galstyan | H01F 27/28 |

FOREIGN PATENT DOCUMENTS

| | | | |
|---|---|---|---|
| JP | 2004055895 | * | 2/2004 |
| JP | 2011-29584 | A | 2/2011 |
| JP | 2012-227427 | A | 11/2012 |
| JP | 2013-162035 | A | 8/2013 |
| JP | 2014-049302 | A | 3/2014 |
| JP | 2014-154684 | * | 8/2014 |
| JP | 5812561 | * | 11/2015 |
| JP | 2018-206975 | A | 12/2018 |
| KR | 10-2013-0132355 | A | 12/2013 |
| KR | 1020150009445 | * | 1/2015 |
| KR | 10-2017-0127397 | A | 11/2017 |

* cited by examiner 24 divisions 20 divisions 16 divisions

INDUCTIVELY-COUPLED PLASMA PROCESSING APPARATUS

CROSS-REFERENCE TO RELATED APPLICATION

This application is based upon and claims the benefit of priority from Japanese Patent Application No. 2019-002703, filed on Jan. 10, 2019, the entire contents of which are incorporated herein by reference.

TECHNICAL FIELD

The present disclosure relates to an inductively-coupled plasma processing apparatus.

BACKGROUND

In a manufacturing process of a flat panel display (FPD) such as a liquid crystal display (LCD) or the like, there is a process of performing plasma processing such as plasma etching or the like on a predetermined film of a rectangular-shaped glass substrate. As a plasma processing apparatus for such process, an inductively-coupled plasma (ICP) processing apparatus having a great advantage that high density plasma can be obtained at a high degree of vacuum has attracted attention.

In the conventional inductively-coupled plasma processing apparatus, a rectangular-shaped dielectric window corresponding to a target substrate is interposed between a high-frequency antenna and a processing chamber. However, in recent years, with an increase in the size of a substrate, an inductively-coupled plasma processing apparatus using a metal window suitable for an increased size has been proposed instead of a dielectric window (Patent Document 1).

In addition, there has been proposed a technique in which the controllability of a plasma distribution for a large substrate is improved by using, as the metal window, a metal window having first divisions mutually electrically insulated and divided into two or more portions along the circumferential direction thereof and a second division mutually electrically insulated and divided along a direction intersecting the circumferential direction (Patent Document 2).

PRIOR ART DOCUMENT

Patent Document

Patent Document 1: Japanese Patent Laid-Open Publication No. 2011-029584
Patent Document 2: Japanese Patent Laid-Open Publication No. 2012-227427

SUMMARY

According to one embodiment of the present disclosure, there is provided an inductively-coupled plasma processing apparatus for performing an inductively-coupled plasma processing on a rectangular substrate, including: a processing container; a mounting table provided inside the processing container and configured to mount the rectangular substrate thereon; a rectangular metal window constituting a top wall of the processing container and provided to be electrically insulated from the processing container while facing the mounting table; and an antenna unit provided above the rectangular metal window and configured to generate an inductively-coupled plasma inside the processing container, wherein the rectangular metal window is divided into divided regions electrically insulated from each other by a first division extending in a radial direction toward each of corner portions of the rectangular metal window, the antenna unit includes a first high-frequency antenna configured as a multi-segmented annular antenna in which a plurality of antenna segments having planar portions facing an upper surface of the rectangular metal window is arranged so that the planar portions form a rectangular frame-shaped region as a whole, each of the plurality of antenna segments is configured by spirally winding an antenna wire in a vertical direction orthogonal to the upper surface of the rectangular metal window so that a winding axis is parallel to the upper surface of the rectangular metal window, and a current supplied to each of the plurality of antenna segments is controllable.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Plasma Processing Apparatus>

Figure 1:
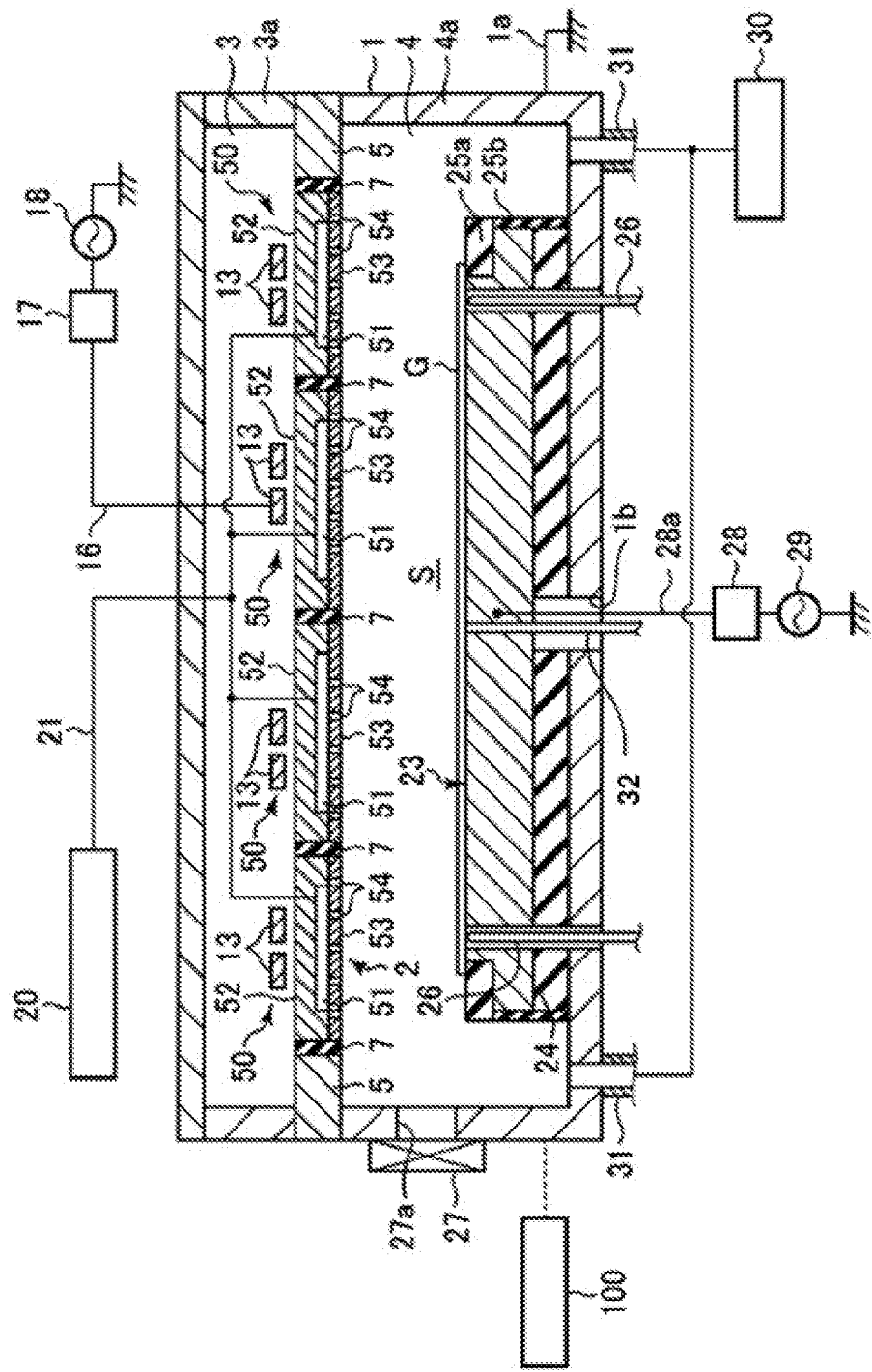
FIG. 1 is a cross-sectional view showing an inductively-coupled plasma processing apparatus according to an embodiment.

First, an inductively-coupled plasma processing apparatus according to an embodiment will be described. FIG. 1 is a cross-sectional view showing the inductively-coupled plasma processing apparatus according to the embodiment. The inductively-coupled plasma processing apparatus shown in FIG. 1 may be used for etching of a metal film, an ITO film, an oxide film or the like, ashing of a resist film, and plasma processing such as formation of a silicon oxide film, a silicon nitride film or the like when forming a thin film transistor on a rectangular substrate, for example, a glass substrate for a FPD. Examples of the FPD may include a liquid crystal display (LCD), an electroluminescence (EL) display, a plasma display panel (PDP), and the like. However, the substrate is not limited to the glass substrate for the FPD.

The inductively-coupled plasma processing apparatus includes a rectangular tube-shaped airtight main body container 1 made of a conductive material, for example, aluminum whose inner wall surface is anodized. The main body container 1 can be assembled with capability to be disassembled, and is electrically grounded by a ground wire 1a.

The main body container 1 is vertically partitioned into an antenna compartment 3 and a chamber (processing container) 4 by a rectangular metal window 2 formed to be insulated from the main body container 1. The metal window 2 constitutes a top wall of the chamber 4. The metal window 2 is made of, for example, a nonmagnetic conductive metal such as aluminum or an alloy containing aluminum. Further, in order to improve the plasma resistance of the metal window 2, a dielectric film or a dielectric cover may be provided on a surface of the metal window 2 at the side of the chamber 4. Examples of the dielectric film may include an anodized film and a sprayed ceramic film. Examples of the dielectric cover may include those made of quartz or ceramics.

A support shelf 5 that protrudes inward of the main body container 1 is provided between a sidewall 3a of the antenna compartment 3 and a sidewall 4a of the chamber 4. The support shelf 5 may be made of a metal of a conductive material, specifically aluminum.

The metal window 2 is divided into a plurality of portions with insulating members 7 interposed therebetween. Further, divided portions 50 of the metal window 2 are supported by the support shelf 5 via the insulating members 7. This is a structure in which the metal window 2 is suspended from a ceiling of the main body container 1 by a plurality of suspenders (not shown). In addition, FIG. 1 schematically shows the division form of the metal window 2, and does not show the actual division form. Various division forms of the metal window 2 will be described later.

Each of the divided portions 50 of the metal window 2 includes a main body portion 52, a shower plate 53 having a plurality of gas discharge holes 54 formed therein, and a gas diffusion space 51 provided between the main body portion 52 and the shower plate 53. A processing gas is introduced into the gas diffusion space 51 from a processing gas supply mechanism 20 through a gas supply pipe 21. The gas diffusion space 51 communicates with the plurality of gas discharge holes 54, and the processing gas is discharged from the gas diffusion space 51 through the plurality of gas discharge holes 54. That is, the metal window 2 is configured as a shower head for discharging a processing gas.

In the antenna compartment 3 above the metal window 2, there is provided an antenna unit 40 including a high-frequency antenna 13 arranged to face the metal window 2 and to extend in an annular shape. As will be described later, the high-frequency antenna 13 is made of a conductive material such as copper or the like, and is spaced apart from the metal window 2 by a spacer (not shown) made of an insulating material. The antenna unit 40 further includes a power feeding part that feeds electric power to the high-frequency antenna 13 as will be described later.

A first high-frequency power supply 18 is connected to the high-frequency antenna 13 of the antenna unit 40 via a power feeding line 16 and a matcher 17. During plasma processing, high-frequency power of 400 kHz to 27.12 MHz, for example, 13.56 MHz, is supplied to the high-frequency antenna 13 via the power feeding line 16 extending from the first high-frequency power supply 18. A loop current is induced in the divided portions 50 of the metal window 2 by an induced electric field formed by the high-frequency antenna 13. Thus, an induced electric field is formed inside the chamber 4 through the loop current induced in the divided portions 50 of the metal window 2. Then, by virtue of this induced electric field, the processing gas supplied from the gas discharge holes 54 of the metal window 2 is turned into plasma in the plasma generation space S immediately below the metal window 2 inside the chamber 4, whereby inductively-coupled plasma is generated. Further, a detailed structure of the antenna unit will be described later.

A mounting table 23 for mounting a rectangular-shaped substrate (hereinafter simply referred to as a substrate) G as a target substrate thereon is fixed to the bottom of the chamber 4 through an insulating member 24 so as to face the high-frequency antenna 13. The mounting table 23 is made of a conductive material, for example, aluminum whose surface is anodized. The substrate G mounted on a mounting surface of the mounting table 23 is adsorptively held by an electrostatic chuck (not shown) provided in the mounting surface.

An insulating shield ring 25a is provided on an upper peripheral edge of the mounting table 23. An insulating ring 25b is provided on a peripheral surface of the mounting table 23. Lift pins 26 for loading and unloading the substrate G therethrough penetrate the mounting table 23 through a bottom wall of the main body container 1 and the insulator member 24. The lift pins 26 are driven up and down by an elevating mechanism (not shown) provided outside the main body container 1 so as to load and unload the substrate G.

A matcher 28 and a second high-frequency power supply 29 are provided outside the main body container 1. The second high-frequency power supply 29 is connected to the mounting table 23 via the matcher 28 by a power feeding line 28a. During plasma processing, the second high-frequency power supply 29 applies high frequency biasing power, for example, high frequency power having a frequency of 3.2 MHz, to the mounting table 23. Ions in the plasma generated inside the chamber 4 are effectively drawn into the substrate G by a self-bias generated by the high-frequency biasing power.

Furthermore, a temperature control mechanism (not shown) including a heating means such as a heater or the like, a refrigerant flow path and the like, and a temperature sensor (not shown) are provided inside the mounting table 23 in order to control a temperature of the substrate G. Pipes and wirings for these mechanism and member are all led out of the main body container 1 through an opening 1b formed in the bottom surface of the main body container 1 and the insulator member 24.

On the sidewall 4a of the chamber 4, a loading/unloading port 27a for loading and unloading the substrate G therethrough and a gate valve 27 for opening and closing the loading/unloading port 27a are provided. An exhaust device 30 including a vacuum pump and the like is connected to the bottom of the chamber 4 through an exhaust pipe 31. The interior of the chamber 4 is evacuated by the exhaust device 30. The interior of the chamber 4 is set and maintained at a predetermined vacuum atmosphere (e.g., 10 mTorr (1.33 Pa)) during plasma processing.

A cooling space (not shown) is formed at the back side of the substrate G mounted on the mounting table 23. A He gas flow path 32 for supplying a He gas as a heat transfer gas having a constant pressure is provided at the back side of the substrate G. By supplying the heat transfer gas to the back side of the substrate G in this way, it is possible to suppress an increase or change in temperature due to plasma processing of the substrate G under vacuum.

The inductively-coupled plasma processing apparatus further includes a control part 100. The control part 100 is composed of a computer. The control part 100 includes a main controller composed of a CPU that controls each component of the plasma processing apparatus, an input device, an output device, a display device, and a memory device. The memory device includes a storage medium that stores parameters for various processes executed in the inductively-coupled plasma processing apparatus, and programs, i.e., processing recipes for controlling processes executed in the inductively-coupled plasma processing apparatus. The main controller calls a predetermined processing recipe stored in the storage medium, and causes the plasma processing apparatus to execute a predetermined processing operation based on the processing recipe.

<Metal Window>

Next, the metal window 2 will be described in detail.

Figure 2:
FIG. 2 is a view showing the main generation principle of inductively-coupled plasma when a metal window is used.
Figure 2:
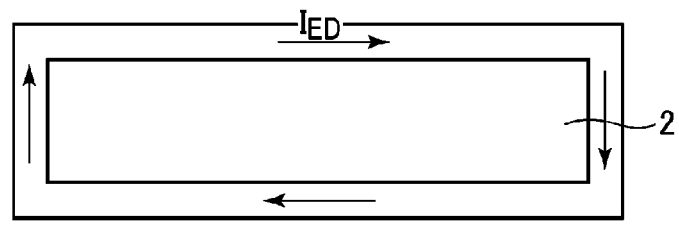
Figure 2:
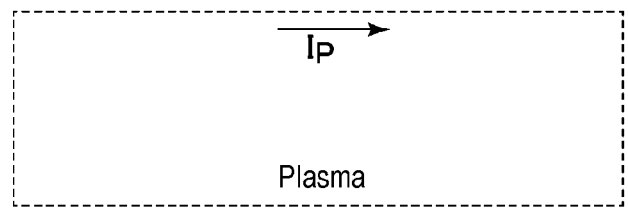

FIG. 2 is a view showing the main generation principle of inductively-coupled plasma when the metal window 2 is used. As shown in FIG. 2, an induced current is generated on an upper surface of the metal window 2 (a surface facing the high-frequency antenna 13) by a high-frequency current $I_{RF}$ flowing through the high-frequency antenna 13. The induced current flows only to the surface portion of the metal window 2 due to a skin effect. However, the metal window 2 is insulated from the support shelf 5 and the main body container 1. Therefore, if a planar shape of the high-frequency antenna 13 is linear, the induced current flowing on the upper surface of the metal window 2 flows toward a side surface of the metal window 2. Then, the induced current flowing toward the side surface flows on a lower surface of the metal window 2 (a surface facing the chamber 4). Furthermore, the induced current returns to the upper surface of the metal window 2 again via the side surface of the metal window 2 to generate an eddy current $I_{ED}$. Thus, the eddy current $I_{ED}$ looping from the upper surface (the surface facing the high-frequency antenna 13) of the metal window 2 to the lower surface thereof (the surface facing the chamber 4) is generated in the metal window 2. Of the looping eddy current $I_{ED}$, the current flowing on the lower surface of the metal window 2 generates an induced electric field $I_P$ inside the chamber 4. Plasma of the processing gas is generated by the induced electric field $I_P$.

On the other hand, when the high-frequency antenna 13 is provided so as to extend around along a circumferential direction in a plane corresponding to the metal window 2, if a solid single plate is used as the metal window 2, no eddy current flows on the lower surface of the metal window 2 so that no plasma is generated. That is, the eddy current $I_{ED}$ generated on the upper surface of the metal window 2 by the high-frequency antenna 13 merely loops on the upper surface of the metal window 2, and the eddy current $I_{ED}$ does not flow on the lower surface of the metal window 2. Therefore, the metal window 2 is formed to have various configurations as described below so that an eddy current flows on the lower surface of the metal window 2 to generate a desired induced electric field.

[First Aspect of Metal Window]

In a first aspect, the metal window 2 is divided into a plurality of divided regions, and the divided regions are insulated from each other. Thus, the eddy current $I_{ED}$ flows toward the lower surface of the metal window 2. That is, by dividing the metal window 2 into a plurality of divided portions insulated from each other, an induced current reaching the side surface flows on the upper surface of the divided metal window, flows from the side surface to the lower surface, flows again through the side surface, and returns to the upper surface, thereby generating a loop-like eddy current $I_{ED}$. For this reason, the metal window 2 is divided into a plurality of divided portions. Several examples of the metal window 2 will be described below. In the following examples, for the sake of convenience in description, a plurality of divided portions 50 of the metal window 2 will be described with different reference numerals assigned to the individual divided portions.

First Example of First Aspect

Figure 3:
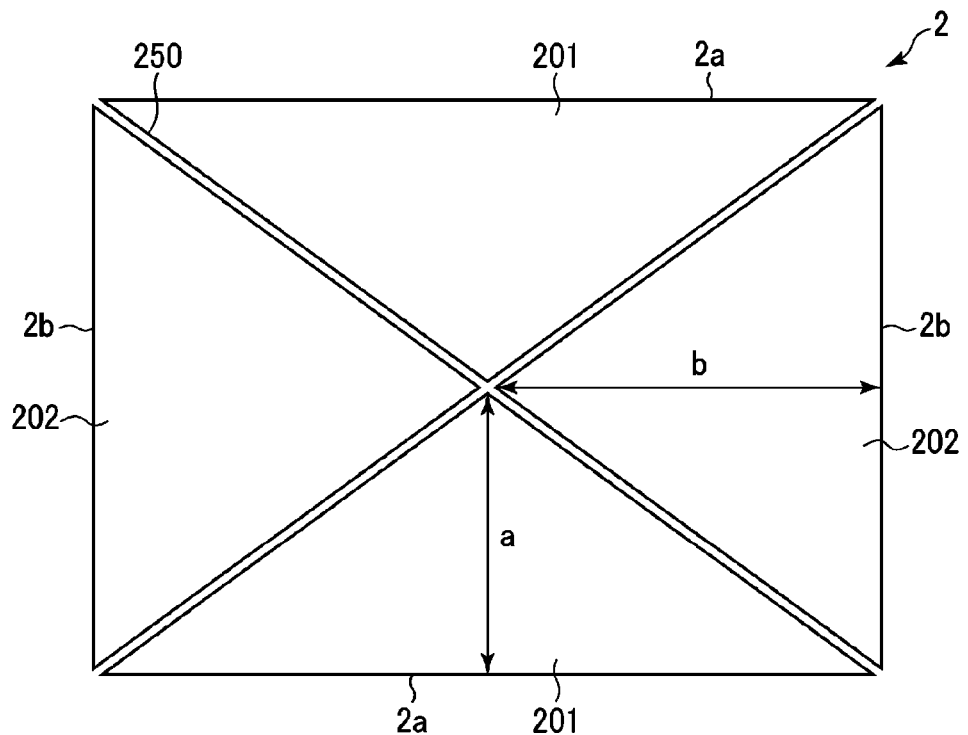
FIG. 3 is a plan view schematically showing a first example of a first aspect of the metal window.

FIG. 3 is a plan view schematically showing a first example of the first aspect of the metal window 2.

The metal window 2 has a rectangular shape with a long side 2a and a short side 2b corresponding to the substrate G. As described above, the high-frequency antenna 13 is provided in an annular shape so as to extend around in a facing relationship with the metal window 2. Therefore, in this example, in order to form an induced electric field uniformly along the lower surface of the metal window 2, a first division is performed by providing radial (diagonal) dividing lines 250 toward individual corner portions of the rectangular metal window 2. Specifically, by virtue of the first division, the metal window 2 is divided into two first divided portions 201 each having the long side 2a and two second divided portions 202 each having the short side 2b. These divided portions 201 and 202 are triangular.

Second Example of First Aspect

Figure 4:
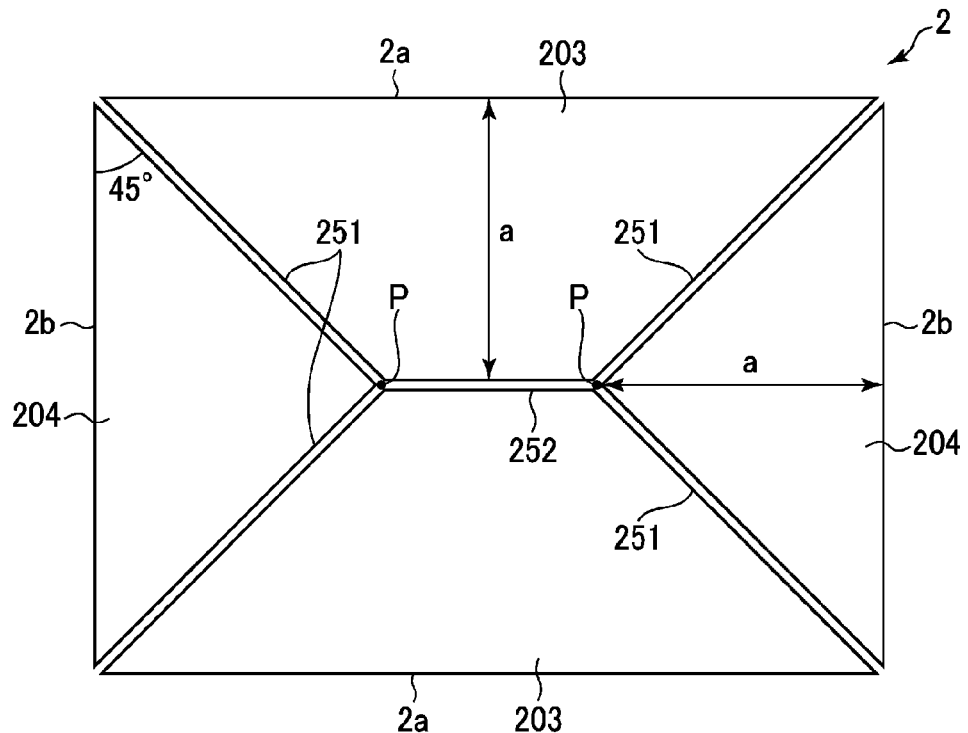
FIG. 4 is a plan view schematically showing a second example of the first aspect of the metal window.

FIG. 4 is a plan view schematically showing a second example of the first aspect of the metal window 2.

In this example, a first division along the radial direction is performed toward individual corner portions so that the divided portions each having the long side 2a becomes first trapezoidal divided portions 203 and the divided portions each having the short side 2b becomes second triangular divided portions 204. In the example of FIG. 3 described above, the metal window 2 has a rectangular shape corresponding to the substrate G. Therefore, a width a (i.e., a height of a triangle constituting each of the first divided portions 201) in the radial direction of each of the first divided portions 201 configured by a triangle having the long side 2a as a bottom (the "radial direction" in a rectangle means a direction extending from the center of the rectangle, namely an intersection of two diagonal lines of the rectangle, toward the periphery of the rectangle, which holds true in the following description) is different from a width b (i.e., a height of a triangle constituting each of the second divided portions 202) in the radial direction of each of the second divided portions 202 configured by a triangle having the short side 2b as a bottom side. An electric field strength of the induced electric field is different between the first divided portions 201 and the second divided portions 202. On the other hand, in the example of FIG. 4, the first divided portion 203 configured by a trapezoid having the long side 2a as a bottom is formed in a trapezoidal shape while maintaining the length of the width a in the radial direction (i.e., a height of the trapezoid constituting each of the first divided portions 203). Therefore, a width in the radial direction of the second divided portion 204 configured by a triangle having the short side 2b as a bottom (i.e., the height of a triangle constituting the second divided portions 204) also coincides with the width a. Thus, the electric field strength of the induced electric field can be made uniform between the first divided portions 203 having the long side 2a and the second divided portions 204 having the short side 2b. For this reason, the uniformity of plasma is further improved. The divisions at this time are performed by first dividing lines 251 of a radial shape extending toward four corner portions of the metal window 2, and a second dividing line 252 parallel to the long side 2a and configured to connect two intersecting points P where two first dividing lines 251 sandwiching the short side 2b intersect each other. An angle of each of the first dividing lines 251 with respect to the extension direction of the second dividing line 252 may be 45 degrees, but may deviate slightly. The degree of deviation is estimated to be, for example, about ±6 degrees.

Third Example of First Aspect

Figure 5:
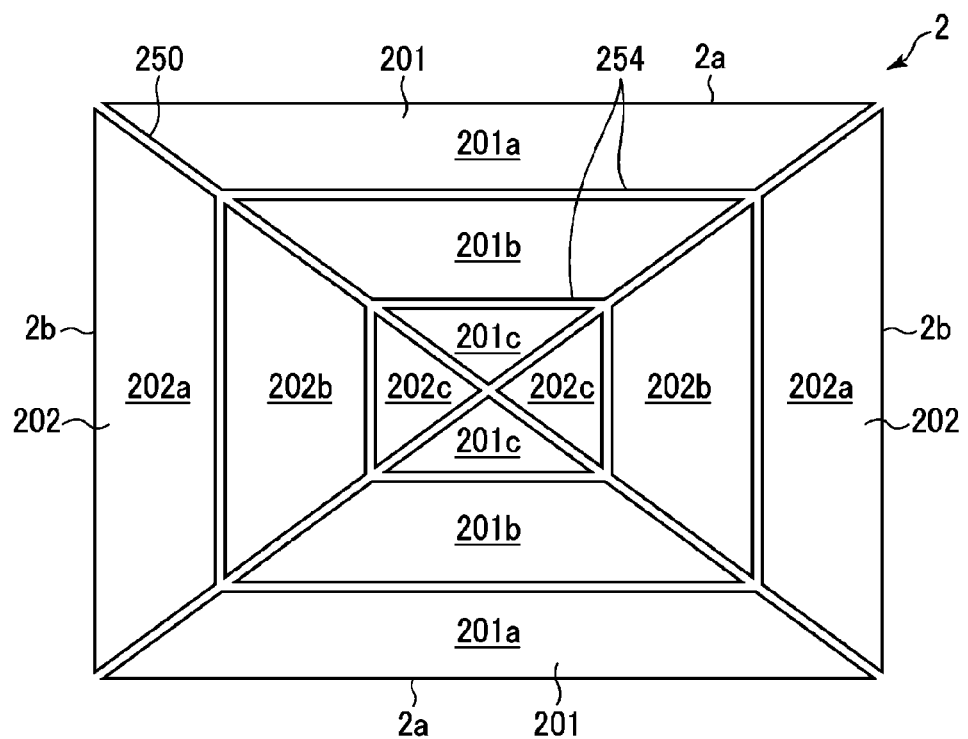
FIG. 5 is a plan view schematically showing a third example of the first aspect of the metal window.

FIG. 5 is a plan view schematically showing a third example of the first aspect of the metal window 2.

In this example, after performing the first division along the radial direction, a second division is further performed so that the divided portions are electrically insulated from each other along the circumferential direction. The second division is performed by the insulating members 7. This example is an example in which the metal window 2 is divided into three portions along the circumferential direction. Specifically, in this example, the first divided portion 201 of the first example shown in FIG. 5 is divided into an outer divided portion 201a, an intermediate divided portion 201b, and an inner divided portion 201c by dividing lines 254. The second divided portion 202 is divided into an outer divided portion 202a, an intermediate divided portion 202b, and an inner divided portion 202c by the dividing lines 254. As a whole, the metal window 2 is divided into three portions in the circumferential direction.

Thus, by dividing the metal window 2 in the circumferential direction so as to be insulated from each other, it is possible to suppress the diffusion of the looping eddy current $I_{ED}$ in a direction orthogonal to the direction in which the looping eddy current $I_{ED}$ flows, and to further improve the controllability of a distribution of the plasma generated inside the chamber 4. Furthermore, by suppressing the diffusion of the looping eddy current $I_{ED}$, it is possible to more strongly generate the looping eddy current $I_{ED}$ on the front surface of the metal window 2, and to generate a stronger induced electric field E inside the chamber 4. The number of divisions of the second division is not limited to three and may be appropriately set according to the size of the substrate G.

A plurality of circumferentially-divided regions (annularly divided regions) formed by performing the second division in the circumferential direction with respect to the metal window 2 corresponds to a plurality of annular high-frequency antennas as will be described later. In this example, the plurality of circumferentially-divided regions are three regions that include an outer circumferentially-divided region composed of outer divided portions 201*a* and 202*a*, an intermediate circumferentially-divided region composed of intermediate divided portions 201*b* and 202*b*, and an inner circumferentially-divided region composed of inner divided portions 201*c* and 202*c*. Thus, an impedance of each antenna part can be adjusted to independently control a current value. High plasma controllability can be obtained by the combination of this effect and the effect of suppressing the diffusion of the looping eddy current $I_{ED}$ by dividing the metal window 2 in the circumferential direction.

Fourth Example of First Aspect

Figure 6:
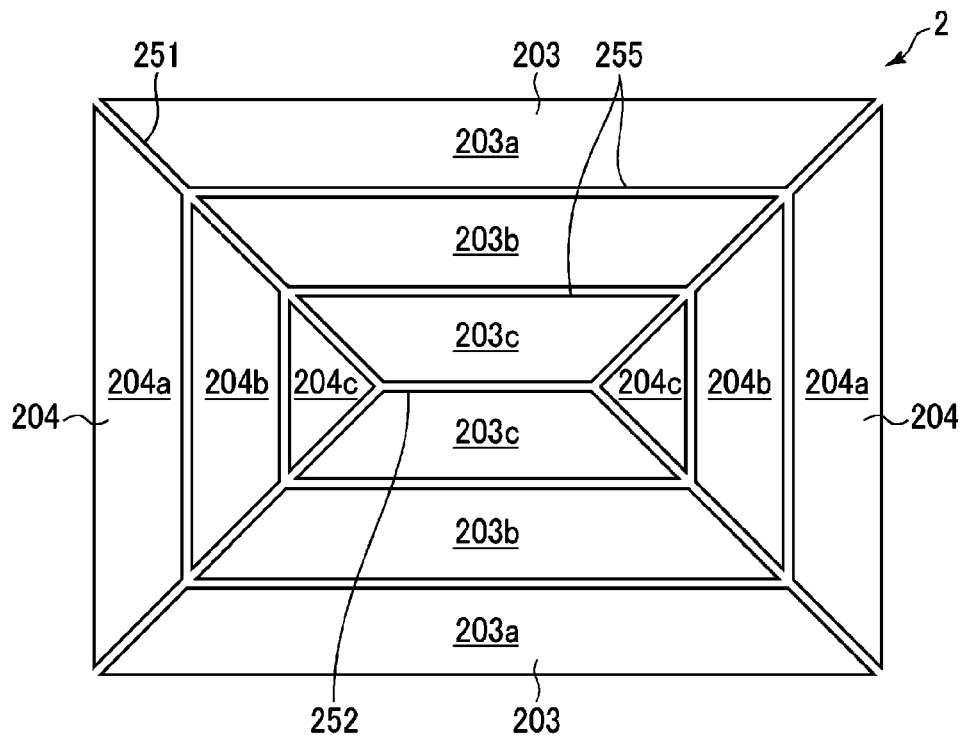
FIG. 6 is a plan view schematically showing a fourth example of the first aspect of the metal window.

FIG. 6 is a plan view schematically showing a fourth example of the first aspect of the metal window 2.

In this example, as in the third example, after performing the first division along the radial direction, a second division is further performed along the circumferential direction so that the divided portions are electrically insulated from each other. The second division is performed by the insulating members 7. This example is an example where the metal window 2 is divided into three portions along the circumferential direction. Specifically, in this example, the first divided portion 203 of the second example shown in FIG. 4 is divided into an outer divided portion 203*a*, an intermediate divided portion 203*b*, and an inner divided portion 203*c* by dividing lines 255, and the second divided portion 204 is divided into an outer divided portion 204*a*, an intermediate divided portion 204*b*, and an inner divided portion 204*c* by the dividing lines 255. As a whole, the metal window 2 is divided into three portions in the circumferential direction.

Even in this example, by dividing the metal window 2 in the circumferential direction so as to be insulated from each other, it is possible to suppress the diffusion of the looping eddy current $I_{ED}$ in a direction orthogonal to the direction in which the looping eddy current $I_{ED}$ flows, and to further improve the controllability of a distribution of the plasma generated inside the chamber 4. Furthermore, by suppressing the diffusion of the looping eddy current $I_{ED}$, it is possible to more strongly generate the looping eddy current $I_{ED}$ on the front surface of the metal window 2, and to generate a stronger induced electric field E inside the chamber 4. The number of divisions of the second division is not limited to three and may be appropriately set according to the size of the substrate G.

Even in this example, a plurality of divided regions formed by performing the second division in the circumferential direction with respect to the metal window 2 corresponds to a plurality of annular high-frequency antennas as will be described later. Thus, an impedance of each antenna part can be adjusted to independently control a current value. High plasma controllability can be obtained by the combination of this effect and the effect of suppressing the diffusion of the looping eddy current $I_{ED}$ by dividing the metal window 2 in the circumferential direction.

Fifth Example of First Aspect

Figure 7:
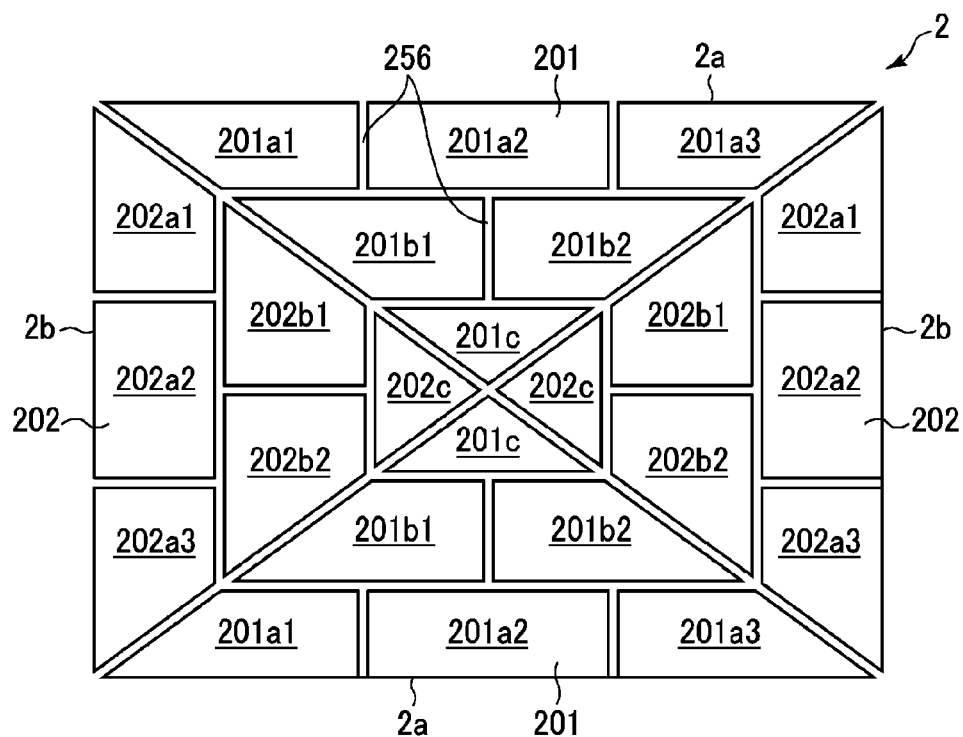
FIG. 7 is a plan view schematically showing a fifth example of the first aspect of the metal window.

FIG. 7 is a plan view schematically showing a fifth example of the first aspect of the metal window 2.

In this example, after performing the first division along the radial direction and the second division along the circumferential direction, a third division is further performed so that the divided portions are electrically insulated from each other in a direction (vertical direction) orthogonal to the circumferential direction. Similarly to the second division, the third division is also performed by the insulating members 7. Specifically, the outer divided portions 201*a* and 202*a* in the third example of FIG. 5 are respectively divided into three small divided portions 201*a*1, 201*a*2, and 201*a*3 and three small divided portions 202*a*1, 202*a*2, and 202*a*3 by dividing lines 256. Furthermore, the intermediate divided portions 201*b* and 202*b* are respectively divided into two small divided portions 201*b*1 and 201*b*2 and two small divided portions 202*b*1 and 202*b*2 by the dividing lines 256. By doing so, the number of divisions of the metal window 2 can be further increased, and the size (area) of the divided regions can be made smaller. Thus, a vertical electric field $E_V$ directed from plasma toward the metal window 2 can be made smaller, and damage to the metal window 2 can be reduced. At this time, the number of divisions of the circumferentially-divided region in the direction intersecting the circumferential direction is arbitrary and may be increased toward the peripheral edge portion of the metal window 2. Therefore, the number of divisions of the portion existing in the outer region of the metal window 2 and having a larger area can be increased. This makes it possible to further increase the number of divisions.

Sixth Example of First Aspect

Figure 8:
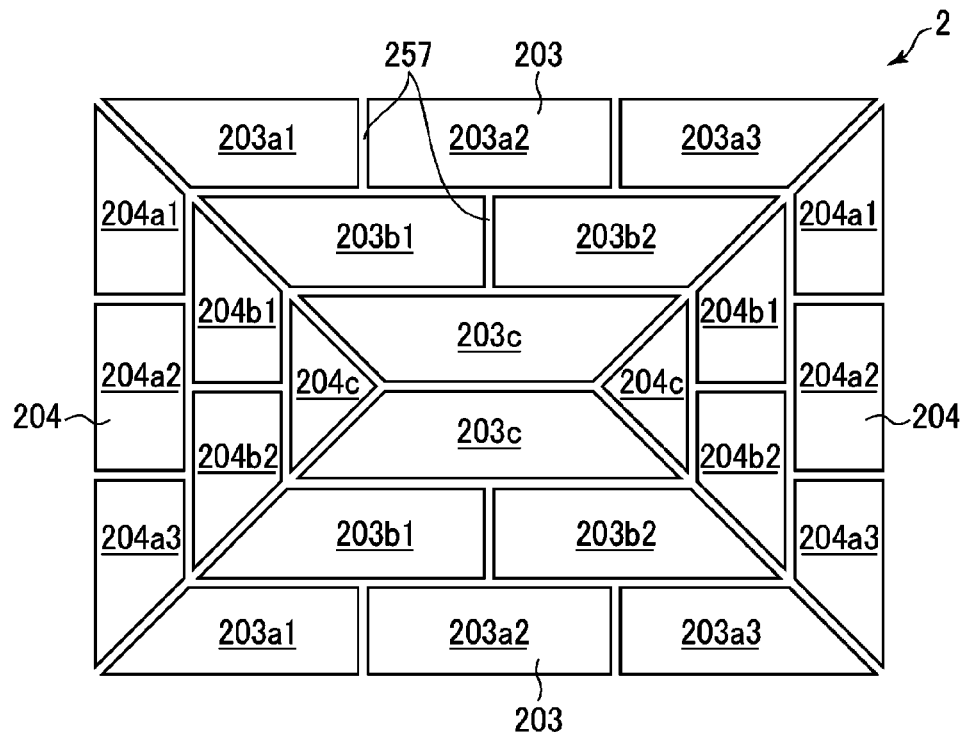
FIG. 8 is a plan view schematically showing a sixth example of the first aspect of the metal window.

FIG. 8 is a plan view schematically showing a sixth example of the first aspect of the metal window 2.

Even in this example, as in the fifth example, after performing the first division along the radial direction and the second division along the circumferential direction, a third division is further performed so that the divided portions are electrically insulated from each other in a direction (vertical direction) orthogonal to the circumferential direction. Specifically, the outer divided portions 203*a* and 204*a* in the fourth example of FIG. 6 are respectively divided into three small divided portions 203*a*1, 203*a*2, and 203*a*3 and three small divided portions 204*a*1, 204*a*2, and 204*a*3 by dividing lines 257. Furthermore, the intermediate divided portions 203*b* and 204*b* are respectively divided into two small divided portions 203*b*1 and 203*b*2 and two small divided portions 204*b*1 and 204*b*2 by the dividing lines 257. Thus, as in the fifth example, the number of divisions of the metal window 2 can be further increased, and the size (area) of the divided regions can be made smaller. The vertical electric field EV directed from plasma toward the metal window 2 can be made smaller, and damage to the metal window 2 can be reduced. Similarly, the number of divisions of the circumferentially-divided region may be increased toward the peripheral edge portion of the metal window 2.

Second Aspect of Metal Window

In a second aspect, the metal window 2 is not divided, and slits are formed at the portions corresponding to the dividing lines of the first aspect. As with the dividing lines of the first aspect, the slits serve as routes through which an induced current flows. Therefore, in the second aspect, the same effects as those of each example of the first aspect can be obtained by forming the slits in the metal window 2 in the directions corresponding to the dividing lines of each example of the first aspect. Hereinafter, specific examples will be described.

First Example of Second Aspect

Figure 9:
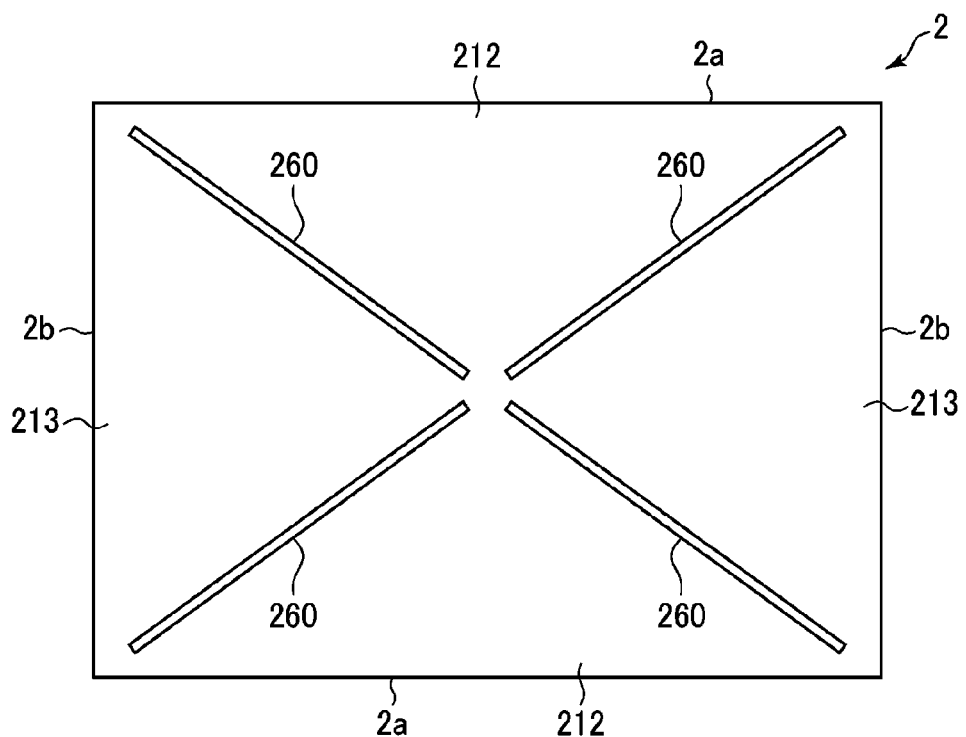
FIG. 9 is a plan view schematically showing a first example of a second aspect of the metal window.

FIG. 9 is a plan view schematically showing a first example of the second aspect of the metal window 2.

In this example, there are provided four radial slits 260 extending toward the corner portions and corresponding to the radial (diagonal) dividing lines of the first example of the first aspect. The metal window 2 is demarcated into two long side regions 212 and two short side regions 213 by the slits. Insulators may be embedded in the slits. The same applies to the following examples.

Second Example of Second Aspect

Figure 10:
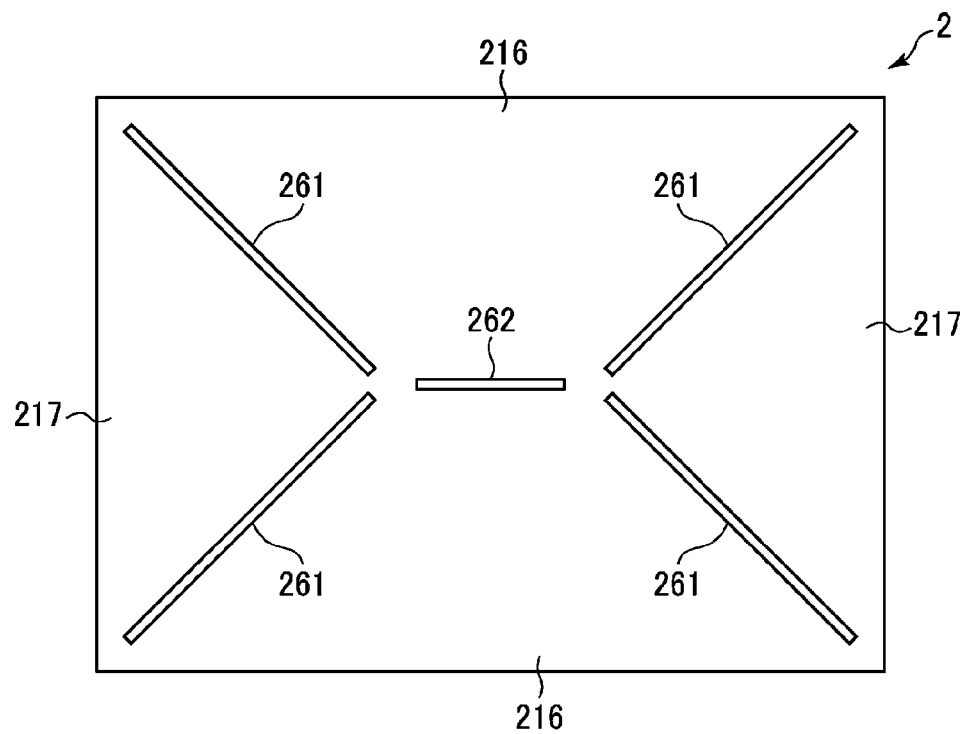
FIG. 10 is a plan view schematically showing a second example of the second aspect of the metal window.

FIG. 10 is a plan view schematically showing a second example of the second aspect of the metal window 2.

In this example, four radial slits 261 corresponding to the first dividing lines 251 of the second example of the first aspect, and a slit 262 corresponding to the dividing line 252 of the second example of the first aspect are provided. The metal window 2 is demarcated into two long side regions 216 and two short side regions 217 by these slits.

Third Example of Second Aspect

Figure 11:
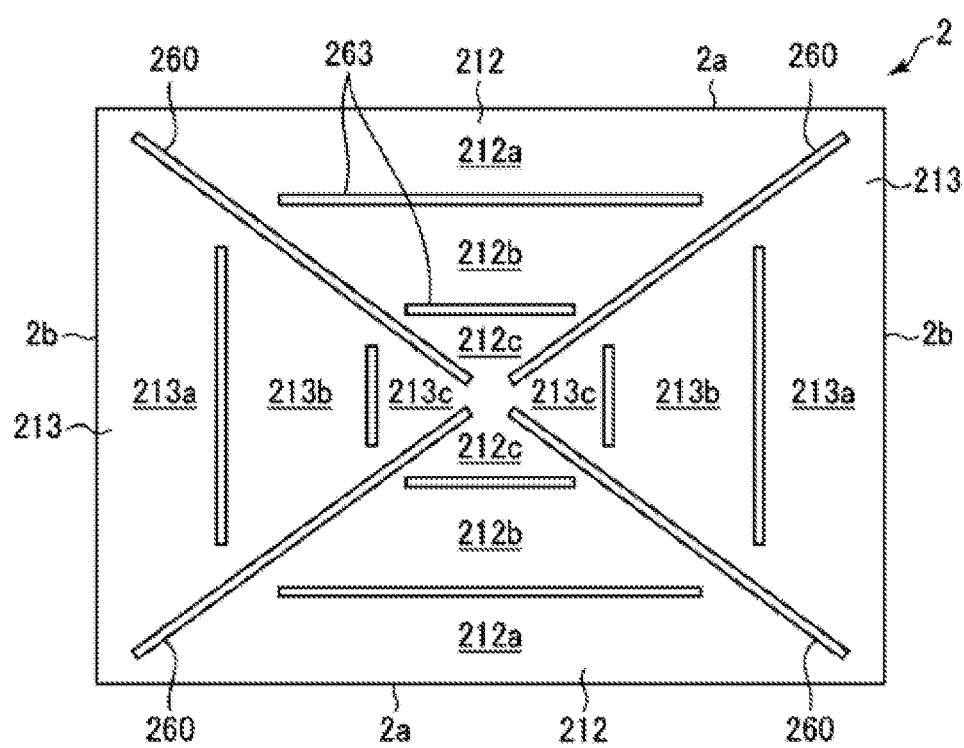
FIG. 11 is a plan view schematically showing a third example of the second aspect of the metal window.

FIG. 11 is a plan view schematically showing a third example of the second aspect of the metal window 2.

In this example, four radial slits 260 corresponding to the radial (diagonal) dividing lines of the first example of the second aspect shown in FIG. 9 are provided, and slits 263 corresponding to the dividing lines of the second division along the circumferential direction are further formed, whereby the metal window 2 is demarcated into three annular regions in the circumferential direction. Specifically, in this example, the long side region 212 is demarcated into an outer region 212*a*, an intermediate region 212*b*, and an inner region 212*c* in the circumferential direction by the slits 263. Furthermore, the short side region 213 is demarcated into an outer region 213*a*, an intermediate region 213*b*, and an inner region 213*c* in the circumferential direction by the slits 263. Thus, as a whole, the metal window 2 is demarcated into three annular regions in the circumferential direction.

Fourth Example of Second Aspect

Figure 12:
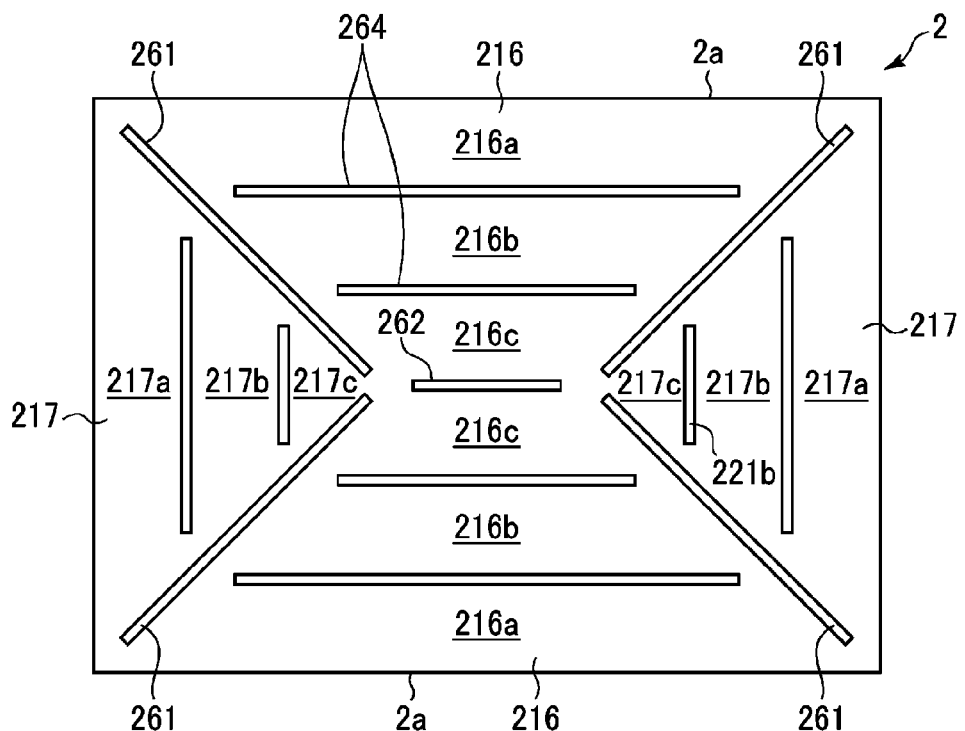
FIG. 12 is a plan view schematically showing a fourth example of the second aspect of the metal window.

FIG. 12 is a plan view schematically showing a fourth example of the second aspect of the metal window 2.

In this example, four radial slits 261 corresponding to the dividing lines of the second example of the second aspect shown in FIG. 10 and a horizontal slit 262 are provided, and slits 264 corresponding to the dividing lines of the second division along the circumferential direction are further formed, whereby the metal window 2 is demarcated into three annular regions (demarcated portions) in the circumferential direction. Specifically, in this example, the long side region 216 is demarcated into an outer region 216*a*, an intermediate region 216*b*, and an inner region 216*c* in the circumferential direction by the slits 264. Furthermore, the short side region 217 is demarcated into an outer region 217*a*, an intermediate region 217*b*, and an inner region 217*c* in the circumferential direction by the slits 264. Thus, as a whole, the metal window 2 is demarcated into three annular regions in the circumferential direction.

Fifth Example of Second Aspect

Figure 13:
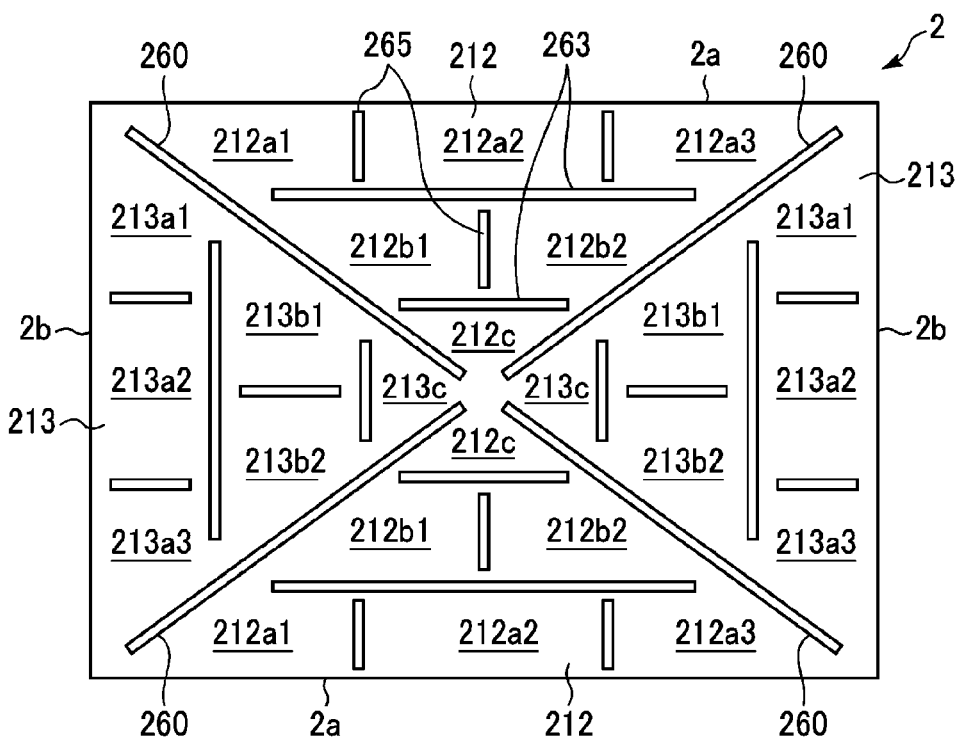
FIG. 13 is a plan view schematically showing a fifth example of the second aspect of the metal window.

FIG. 13 is a plan view schematically showing a fifth example of the second aspect of the metal window 2.

In this example, the metal window 2 is demarcated by four radial (diagonal) slits 260 and circumferential slits 263 as in the third example shown in FIG. 11, and then slits 265 corresponding to the third division are formed. Specifically, the outer regions 212*a* and 213*a* of the third example of FIG. 11 are respectively demarcated into three demarcated portions, i.e., three small regions 212*a*1, 212*a*2, and 212*a*3 and three small regions 213*a*1, 213*a*2, and 213*a*3, by the slits 265. Furthermore, the intermediate regions 212*b* and 213*b* are respectively demarcated into two demarcated portions, i.e., two small regions 212*b*1 and 212*b*2 and two small regions 213*b*1 and 213*b*2, by the slits 265.

Sixth Example of Second Aspect

Figure 14:
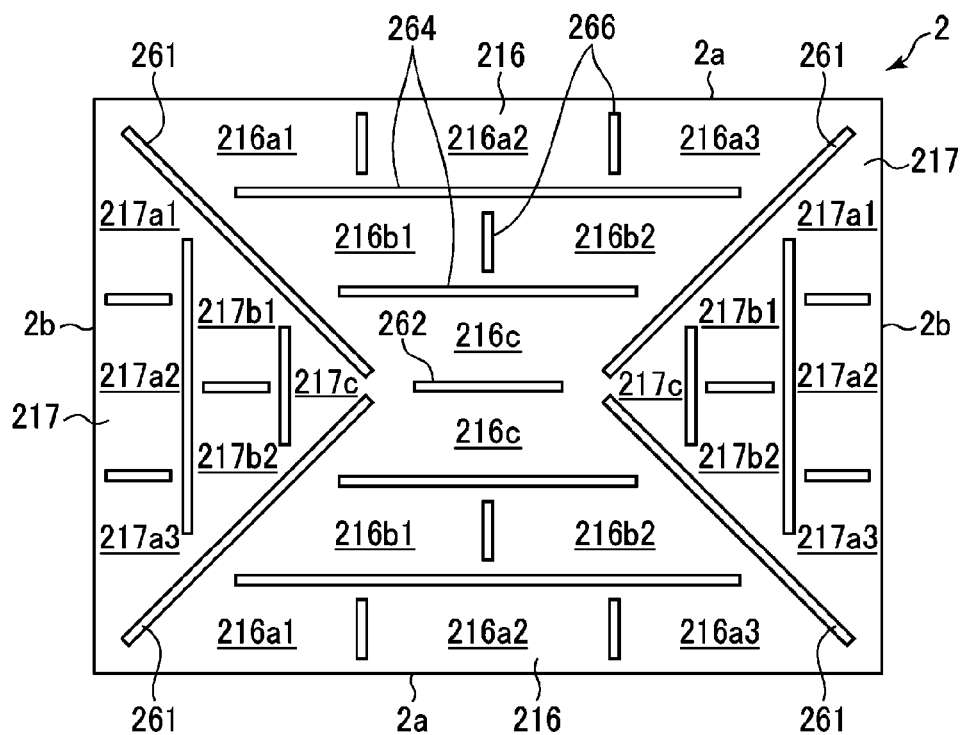
FIG. 14 is a plan view schematically showing a sixth example of the second aspect of the metal window.

FIG. 14 is a plan view schematically showing a sixth example of the second aspect of the metal window 2.

In this example, the metal window 2 is demarcated by the four radial slits 261, the slit 262, and the circumferential slits 264 as in the fourth example shown in FIG. 12, and then slits 266 corresponding to the third division are formed. Specifically, the outer regions 216*a* and 217*a* of the fourth example of FIG. 12 are respectively demarcated into three demarcated portions, i.e., three small regions 216*a*1, 216*a*2, and 216*a*3 and three small regions 217*a*1, 217*a*2, and 217*a*3, by the slits 266. Furthermore, the intermediate regions 216*b* and 217*b* are respectively demarcated into two demarcated portions, i.e., two small regions 216*b*1 and 216*b*2 and two small regions 217*b*1 and 217*b*2, by the slits 266.

[Third Aspect of Metal Window]

Figure 15:
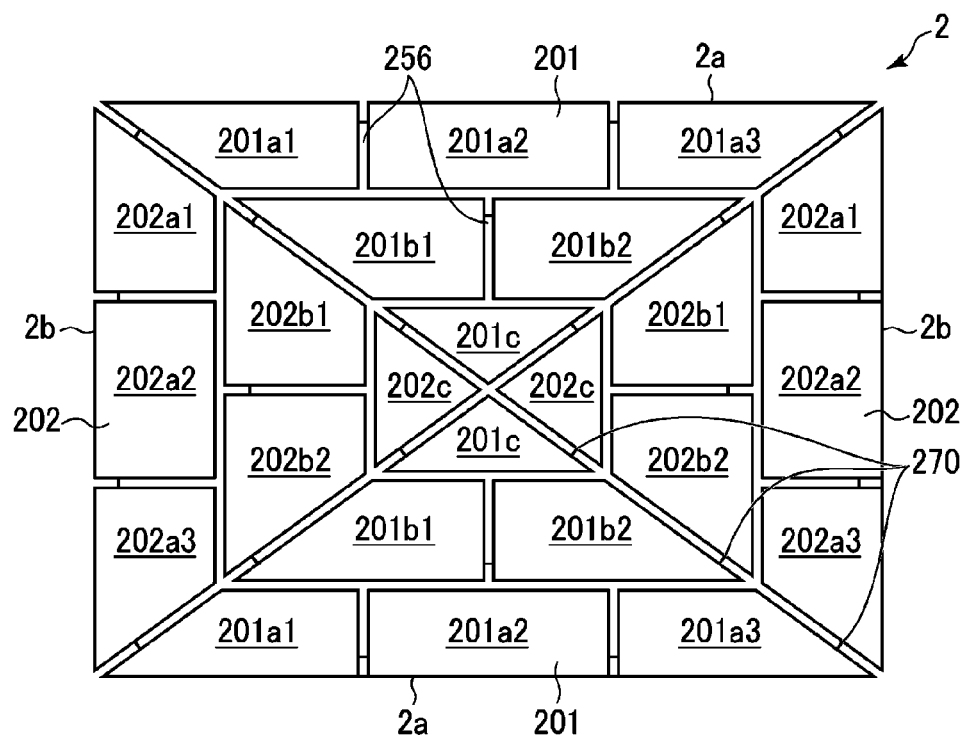
FIG. 15 is a plan view schematically showing a first example of a third aspect of the metal window.
Figure 16:
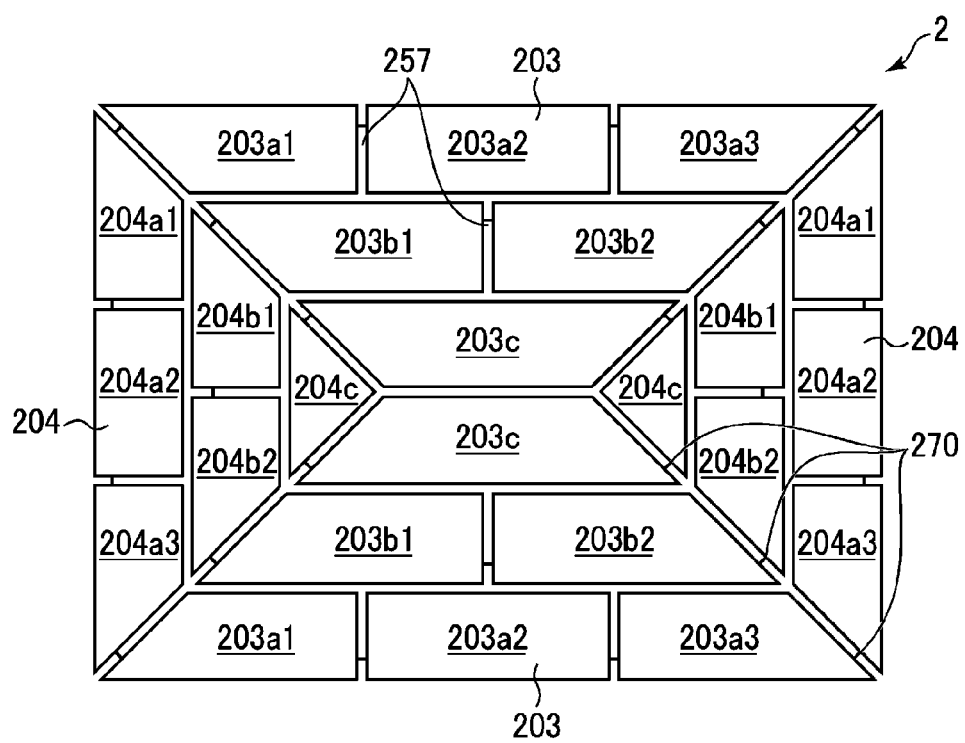
FIG. 16 is a plan view schematically showing a second example of the third aspect of the metal window.

In a third aspect, the metal window 2 is divided into a plurality of portions by insulating members so as to be insulated from each other, and the divided portions are connected in the circumferential direction by conductive connecting members 270 such as conductive wires or the like. Thus, in each divided portion of the metal window 2, an eddy current $I_{ED}$ flows from the upper surface to the lower surface through the side surface, and a closed loop current flows along a closed loop including the conductive members on the upper surface of the metal window 2. That is, a current also flows through the conductive connecting member 270 between the divided portions. Thus, an induced electric field can be generated between the divided portions, and the position where the induced electric field is generated can be adjusted by changing the connection position. This makes it possible to more appropriately adjust the distribution of the induced electric field. FIG. 15 shows a first example of the third aspect that has a configuration in which the third aspect is applied to the fifth example of the first aspect shown in FIG. 7. FIG. 16 shows a second example of the third aspect that has a configuration in which the third aspect is applied to the sixth example of the first aspect shown in FIG. 8. In these examples, the respective divided portions are connected to each other by the conductive connecting members 270 in the circumferential direction in each of the outer divided portion, the intermediate divided portion, and the inner divided portion. Furthermore, by providing one or more capacitive elements in the conductive connecting member 270, it is possible to adjust the impedance of the closed loop and to adjust the intensity of the induced electric field formed between the divided portions.

<Antenna Unit>

Next, the antenna unit 40 will be described in detail.

Figure 17:
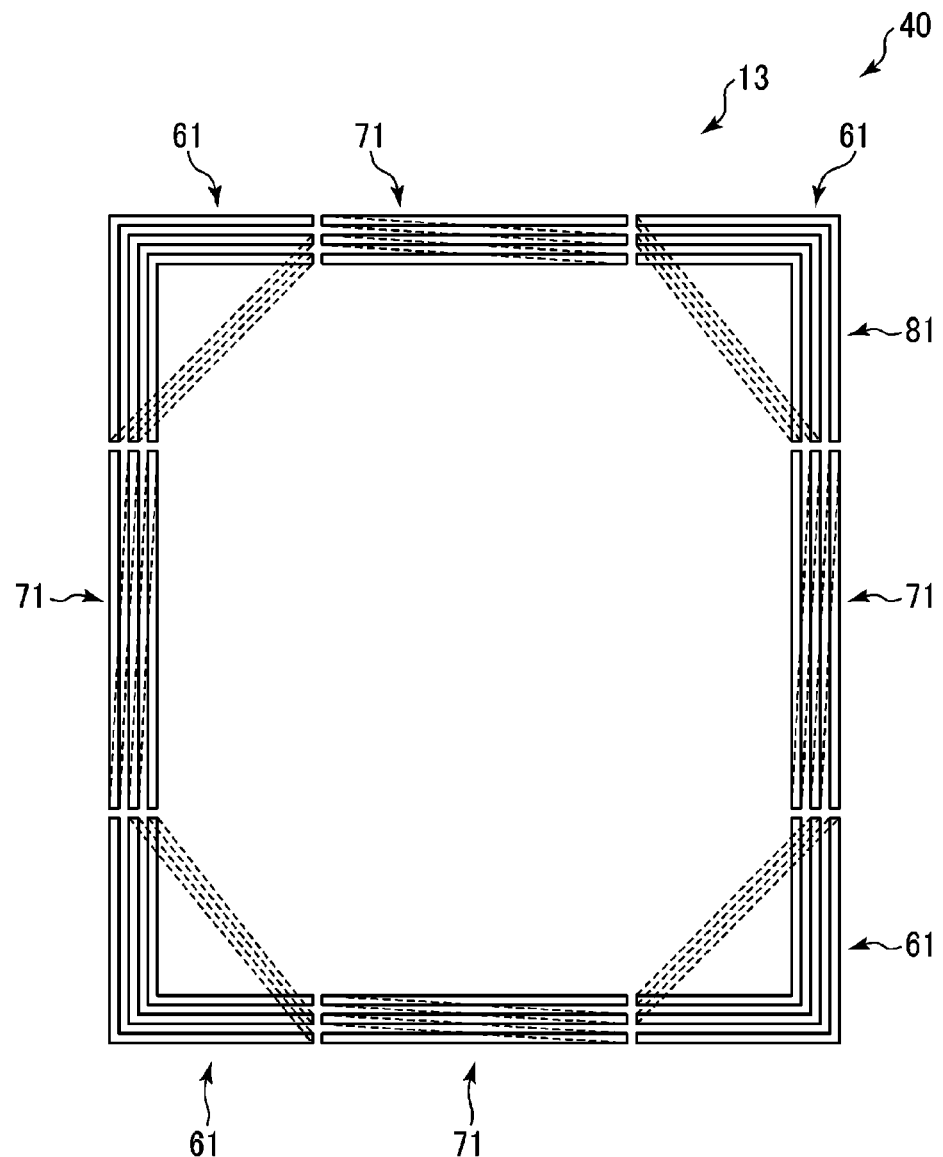
FIG. 17 is a schematic plan view showing an example of a high-frequency antenna of an antenna unit.

FIG. 17 is a schematic plan view showing an example of the high-frequency antenna 13 of the antenna unit 40. As shown in FIG. 17, the high-frequency antenna 13 is formed of a plurality of antenna segments having planar portions formed to face the upper surface of the metal window 2, wherein the antenna segments are arranged in an annular shape so that the planar portions as a whole form a rectangular frame-shaped region 81 for generating an induced electric field that contributes to plasma generation. That is, the high-frequency antenna 13 is configured as a multi-segmented annular antenna.

Specifically, the high-frequency antenna 13 includes a plurality of first antenna segments 61 that constitute corner portions of the frame-shaped region 81, and a plurality of second antenna segments 71 that constitute side portions of the frame-shaped region 81. In FIG. 17, for the sake of convenience in description, there are shown four first antenna segments 61 and four second antenna segments 71. However, the number of the second antenna segments 71 may be two or more for each side portion.

Figure 18:
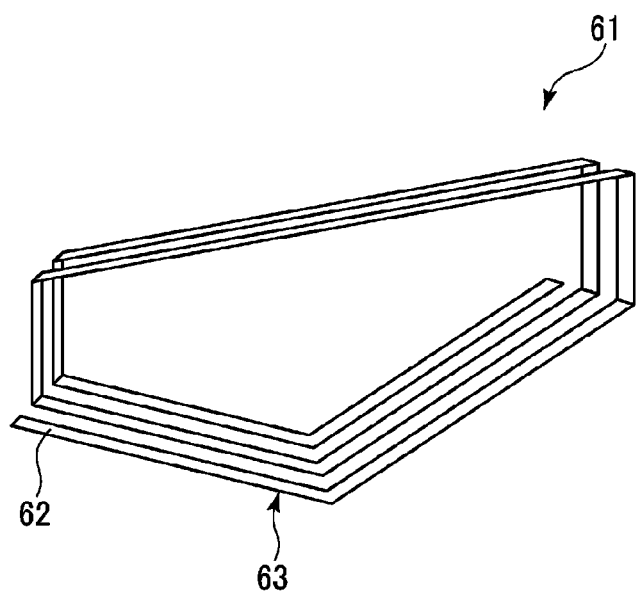
FIG. 18 is a perspective view showing a first antenna segment of the high-frequency antenna shown in FIG. 17.

For example, as shown in FIG. 18, the first antenna segment 61 is configured by an antenna wire 62 made of a conductive material such as, for example, copper or the like. The antenna wire 62 is spirally wound in a vertical direction orthogonal to the upper surface of the metal window 2 so that a winding axis is parallel to the upper surface of the metal window 2. The first antenna segment 61 constitutes a portion (corner portion) of the frame-shaped region 81 where the planar portion 63 facing the metal window 2 generates an induced electric field that contributes to plasma generation. In the planar portion 63, three antenna wires 62 are arranged in parallel to each other so as to form a corner portion. In FIG. 18, the upper antenna wire 62 that faces the planar portion 63 of the first antenna segment 61 is configured as a straight line. However, the upper antenna wire 62 may be configured so as to form a corner portion like the planar portion 63.

Figure 19:
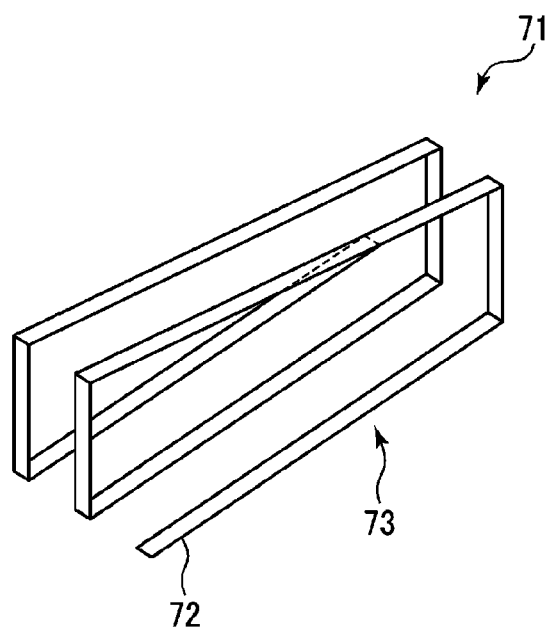
FIG. 19 is a perspective view showing a second antenna segment of the high-frequency antenna shown in FIG. 17.

Furthermore, as shown, for example, in FIG. 19, the second antenna segment 71 is configured by an antenna wire 72 made of a conductive material such as, for example, copper or the like. The antenna wire 72 is spirally wound in a vertical direction orthogonal to the upper surface of the metal window 2 so that a winding axis is parallel to the metal window 2. The second antenna segment 71 constitutes a portion (side portion) of the frame-shaped region 81 where the planar portion 73 facing the metal window 2 generates an induced electric field that contributes to plasma generation. In the planar portion 73, three antenna wires 72 are arranged in parallel to each.

Figure 20:
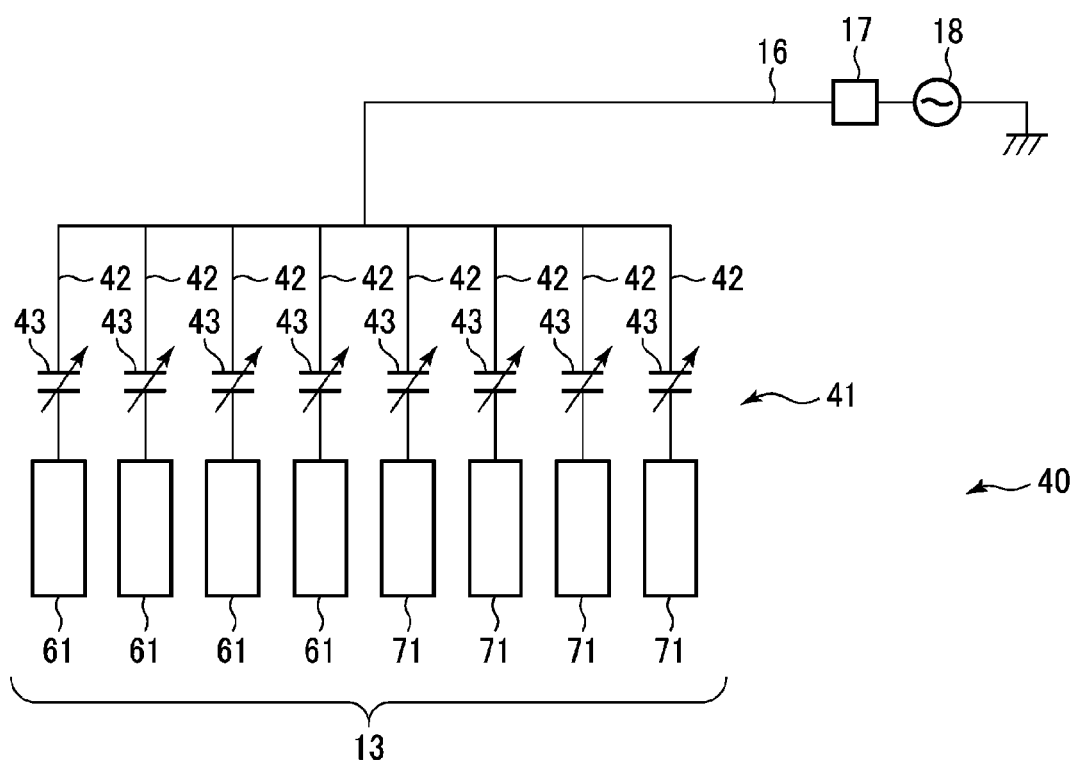
FIG. 20 is a schematic view showing an example of a power feeding part of the antenna unit.

High frequency power is supplied from the first high-frequency power supply 18 to the first antenna segment 61 and the second antenna segment 71 via a power feeding part 41. For example, as shown in FIG. 20, the power feeding part 41 includes a plurality of branch lines 42 branched from the power feeding line 16 and respectively connected to the first antenna segments 61 and the second antenna segments 71 of the high-frequency antenna 13. These branch lines 42 are provided with variable capacitors 43 as impedance adjustment parts. The branch lines 42 are connected to power feeding terminals (not shown) provided at the respective ends of the first antenna segment 61 and the second antenna segment 71 of the high-frequency antenna 13.

Each of the first antenna segment 61 and the second antenna segment 71 of the high-frequency antenna 13 and the variable capacitor 43 connected thereto constitute an antenna circuit. By adjusting a capacitance of the variable capacitor 43, an impedance of each antenna circuit is controlled. As a result, a current flowing through each antenna circuit can be controlled.

By controlling the current flowing through the antenna circuit in this way, it is possible to control an induced electric field in a plasma control area corresponding to each antenna segment and to finely control a plasma density distribution. In particular, the current at the corner portion and the side portion can be controlled independently, and the controllability of plasma in the region corresponding to the corner portion and the region corresponding to the side portion in the chamber 4 can be improved to form uniform plasma.

Moreover, regardless of the number of divisions of the regions corresponding to the high-frequency antenna 13 of the metal window 2 (even when the number of divisions of the antenna is larger than the number of divisions of the metal window 2), a plasma control that reflects the antenna division areas can be performed by increasing the number of divisions of the high-frequency antenna 13. This makes it possible to enhance the plasma uniformity.

In the region corresponding to the high-frequency antenna 13 in the metal window 2, namely in each of the outer region, the intermediate region, and the inner region, the relationship between the number of divisions (the number of demarcations) of the metal window 2 and the number of divisions of the high-frequency antenna 13 (the number of antenna segments)) is optional.

Figure 21:
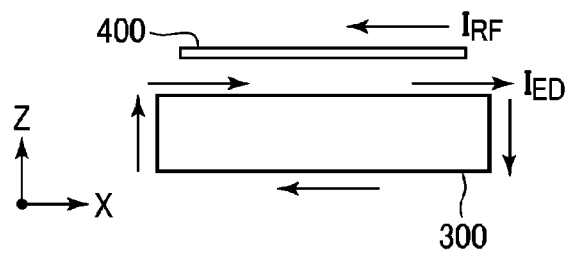
FIG. 21 is a view showing a first example of the arrangement relationship between a divided portion of the metal window and the antenna segment.
Figure 21:
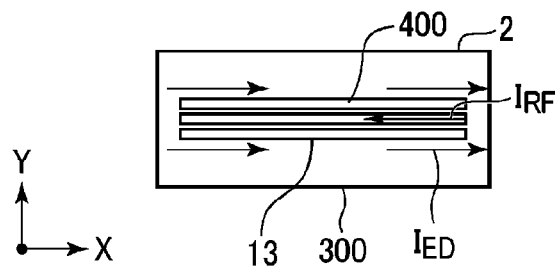
Figure 22:
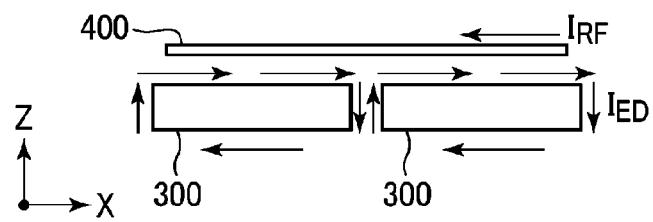
FIG. 22 is a view showing a second example of the arrangement relationship between the divided portion of the metal window and the antenna segment.
Figure 22:
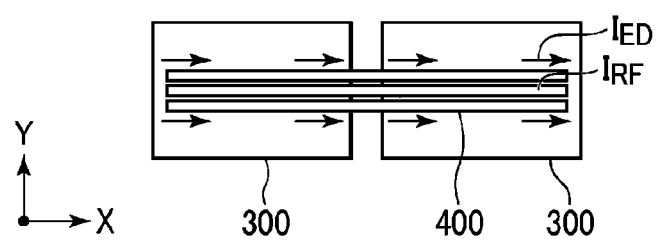

For example, as in a first example shown in FIG. 21, one antenna segment 400 may be arranged for one divided portion 300 (demarcated region) of the metal window 2 (the number of window divisions =the number of antenna divisions). In this case, a length of the antenna segment 400 may be shorter than that of the divided portion 300, or may be equal to or longer than that of the divided portion 300. Further, as described herein, the divided portions of the metal window are referred to as "divided portion 300" without distinguishing them, and the first antenna segments 61 and the second antenna segments 71 are referred to as "antenna segment 400" without distinguishing them. Only the planar portion of the antenna segment is shown (the same applies to FIGS. 22 to 26 below). Furthermore, as in a second example shown in FIG. 22, one antenna segment 400 may be installed for two (or more) divided portions 300 of the metal window 2 (the number of window divisions>the number of antenna divisions). In this case, the divided portions 300 correspond to only one antenna segment 400. From the high-frequency current $I_{RF}$ of the antenna segment 400, one eddy current $I_{ED}$ flows through one divided portion 300 so as to loop linearly in the X direction which is the antenna arrangement direction.

Figure 23:
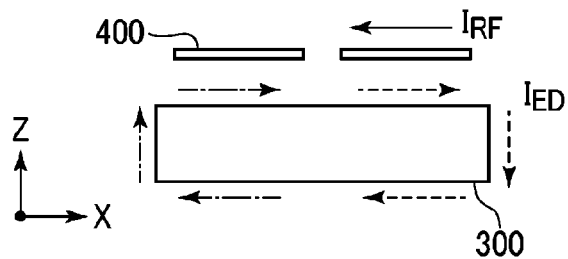
FIG. 23 is a view showing a third example of the arrangement relationship between the divided portion of the metal window and the antenna segment.
Figure 23:
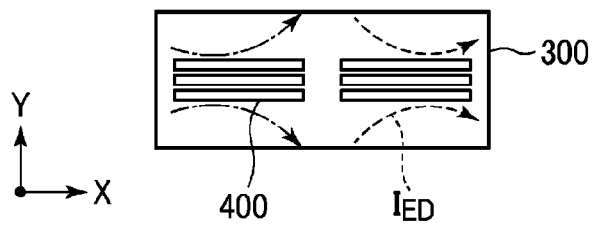
Figure 24:
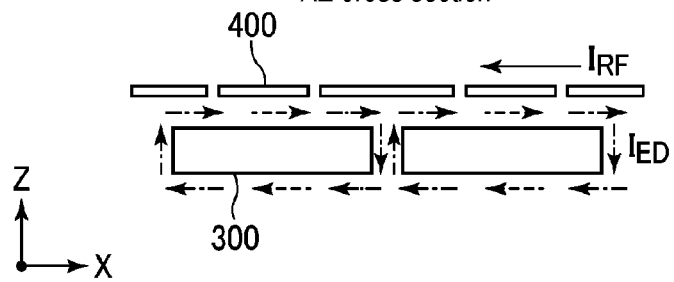
FIG. 24 is a view showing a fourth example of the arrangement relationship between the divided portion of the metal window and the antenna segment.
Figure 24:
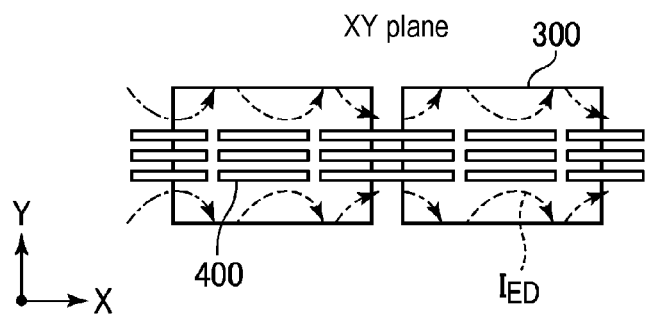

Further, for example, as illustrated in third and fourth examples shown in FIGS. 23 and 24, two or more antenna segments 400 may be arranged for one divided portion 300. In the example of FIG. 23, two antenna segments are arranged for one divided portion 300 of the metal window 2. In the example of FIG. 24, five antenna segments 400 are arranged for two divided portions 300. That is, the number of the antenna segments 400 is larger than the number of the divided portions 300 of the metal window 2 (the number of window divisions<the number of antenna divisions). As in the example of FIG. 24, the antenna segment 400 may extend over a plurality of divided portions 300. As shown in FIGS. 23 and 24, when two or more antenna segments 400 are arranged for one divided portion 300, the eddy current $I_{ED}$ induced by each antenna segment 400 spreads not only in the X direction which is the antenna arrangement direction but also in the Y direction which is a plane direction orthogonal to the X direction. The eddy current $I_{ED}$ passes through the side surface of the divided portion 300 in the Y direction and moves to the back surface of the divided portion 300, thereby drawing a loop. That is, the eddy current $I_{ED}$ spreads along a plane. As a result, it is possible to further enhance the controllability of the induced electric field formed in the chamber 4 for each antenna segment and hence the controllability of plasma.

This holds true when the metal window 2 is demarcated by slits without dividing the metal window 2. Furthermore, in the examples of FIGS. 23 and 24, all the divided portions 300 do not need to be arranged as illustrated and at least one of the divided portions 300 may be arranged as illustrated.

Figure 25:
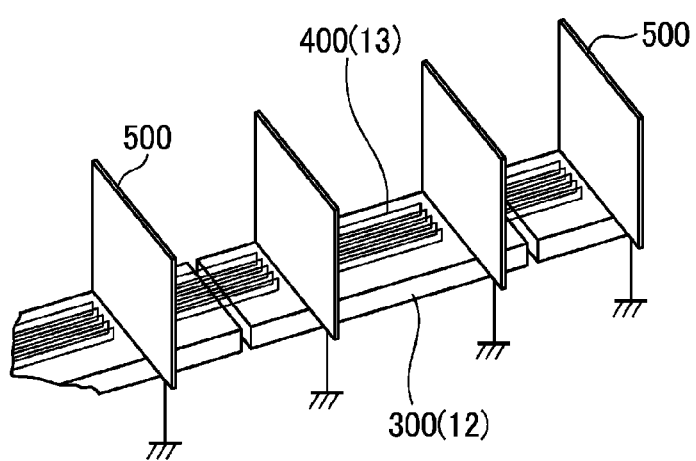
FIG. 25 is a perspective view showing a state in which partition plates are provided between the antenna segments.
Figure 26:
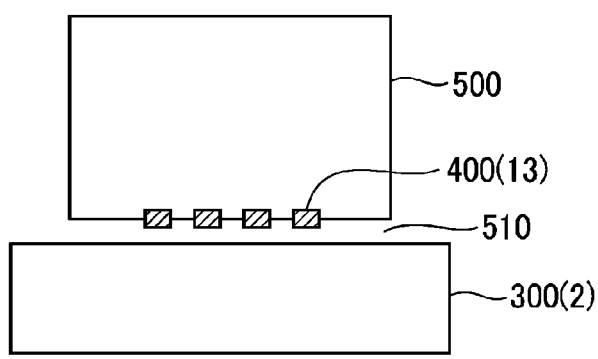
FIG. 26 is a side cross-sectional view showing a state in which the partition plates are provided between the antenna segments.

As shown in FIG. 25, grounded partition plates 500 may be provided between the antenna segments 400 of the divided high-frequency antenna 13 in a state in which the grounded partition plates 500 are insulated from the metal window 2. By isolating the antenna segments 400 with the partition plates 500, the mutual interference of induced electric fields formed by the individual antenna segments 400 between the adjacent antenna segments 400 can be prevented to enhance the controllability of the currents of the antenna segments 400. Thus, it is possible to enhance the independent controllability of the induced electric fields by the antenna segments 400. As shown in FIG. 26, the partition plates 500 are insulated from the metal window 2 by forming a gap 510 of about 10 mm between lower ends of the partition plates 500 and the metal window 2 (the divided portions 300 or the demarcated portions). By insulating the partition plates 500 from the metal window 2, it is possible to prevent abnormal discharge and adverse effects on the induced electric field.

By installing the plurality of antenna segments 400 for one divided portion 300 (demarcated portion) of the metal window 2 and preventing the interference of the induced electric fields between the antenna segments 400 with the partition plates 500 to enhance the current controllability, fine plasma control can be performed by segmented high-frequency antennas without increasing the number of divisions (the number of demarcations) of the metal window 2.

When there is a need to control the plasma distribution in the radial direction of the substrate G, the antenna unit 40 may include, in addition to the high-frequency antenna 13, one or more additional high-frequency antennas having an annular shape, and these high-frequency antennas may be arranged in a concentric relationship with each other to form a multi-ring-shaped antenna. The radial plasma distribution in the chamber 4 can be controlled by separately controlling the currents of the respective high-frequency antennas (annular antennas). The current control of such a multi-ring-shaped antenna is performed by connecting variable capacitors to the additional high-frequency antennas (antenna segments in the case of multi-segmented annular antennas) to form antenna circuits as shown in FIG. 20 and controlling the impedance of each of the antenna circuits.

The additional high-frequency antenna may be a multi-segmented annular antenna similar to the high-frequency antenna 13 or a spiral planar antenna. When a multi-ring-shaped antenna is formed in this way, at least the outermost high-frequency antenna may be a multi-segmented annular antenna. Thus, it is possible to control the plasma distribution in regions of the plasma space corresponding to the corner portions of the substrate G and regions of the plasma space corresponding to the side portions between the corner portions.

Figure 27:
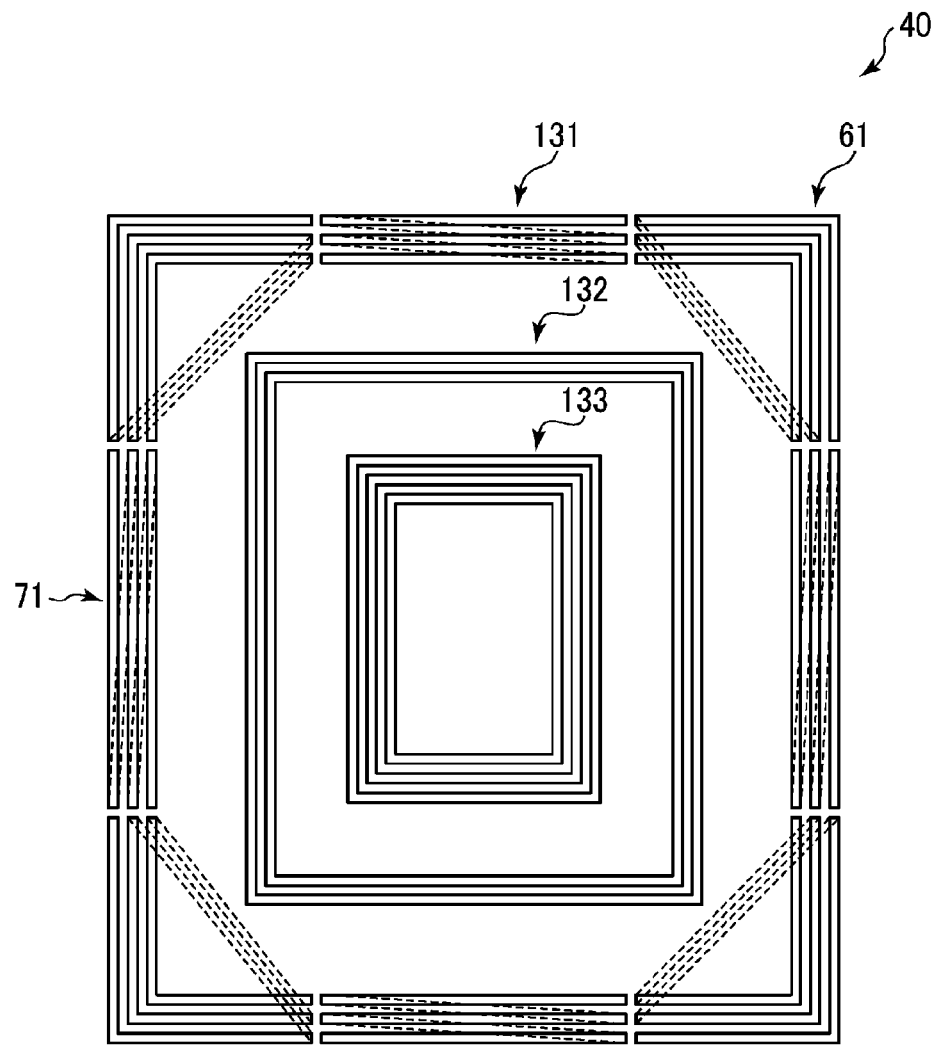
FIG. 27 is a schematic plan view showing an example of a multi-ring-shaped antenna constituting the antenna unit.

As shown in FIG. 27, as the multi-ring-shaped antenna constituting the antenna unit 40, for example, there is illustrated an antenna including three ring-shaped antennas in which an outer high-frequency antenna 131 composed of a multi-segmented annular antenna similar to the high-frequency antenna 13 is disposed on the outermost side, an intermediate high-frequency antenna 132 as a spiral planar antenna is disposed inward of the outer high-frequency antenna 131, and an inner high-frequency antenna 133 as a spiral planar antenna is disposed on the innermost side.

Figure 28:
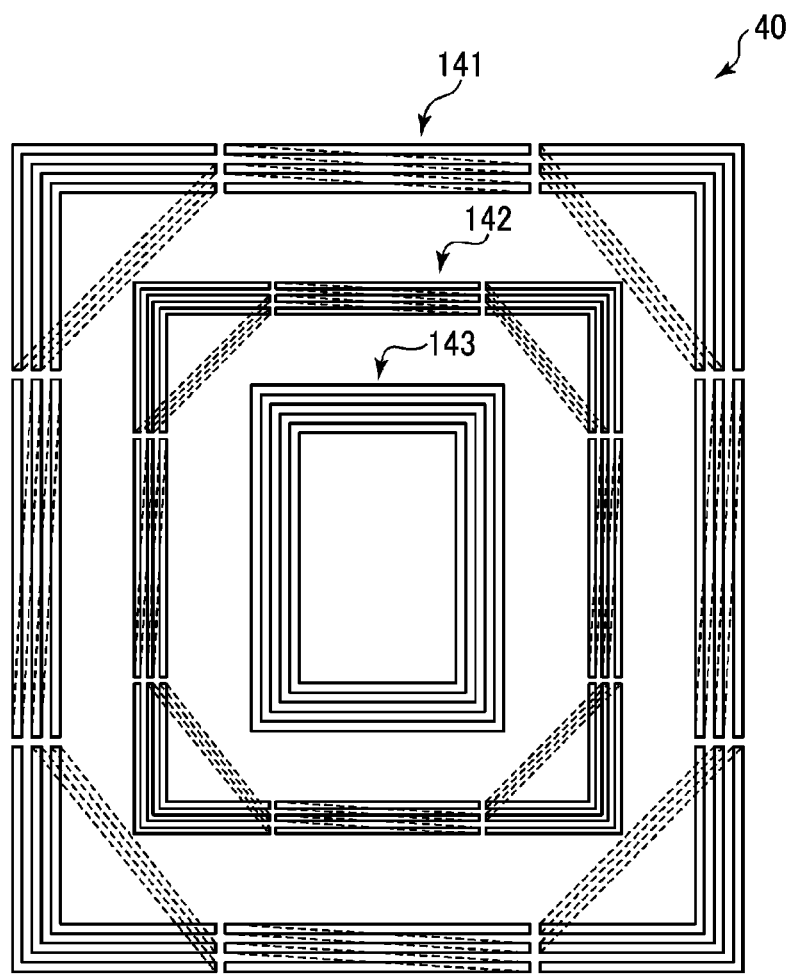
FIG. 28 is a schematic plan view showing another example of the multi-ring-shaped antenna constituting the antenna unit.

Further, as illustrated in FIG. 28, as the antenna unit 40, there is illustrated an antenna including three ring-shaped antennas in which an outer high-frequency antenna 141 as a multi-segmented annular antenna similar to the high-frequency antenna 13 is disposed on the outermost side, an intermediate high-frequency antenna 142 as a multi-segmented annular antenna is disposed inward of the outer high-frequency antenna 141, and an inner high-frequency antenna 143 as a spiral planar antenna is disposed on the innermost side.

Figure 29:
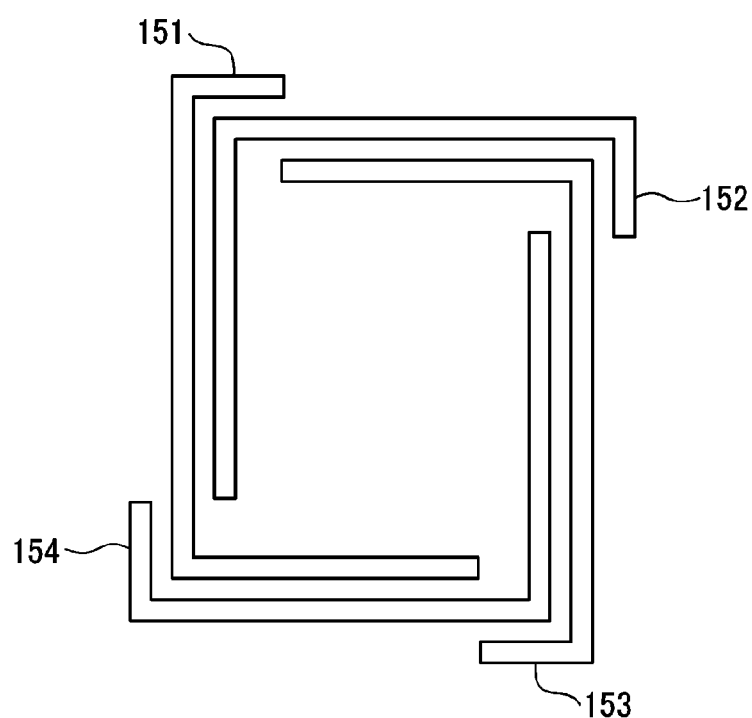
FIG. 29 is a plan view showing an example of a spiral planar antenna that constitutes an intermediate high-frequency antenna of FIG. 27, an inner high-frequency antenna of FIG. 27, and an inner high-frequency antenna of FIG. 26.
Figure 30:
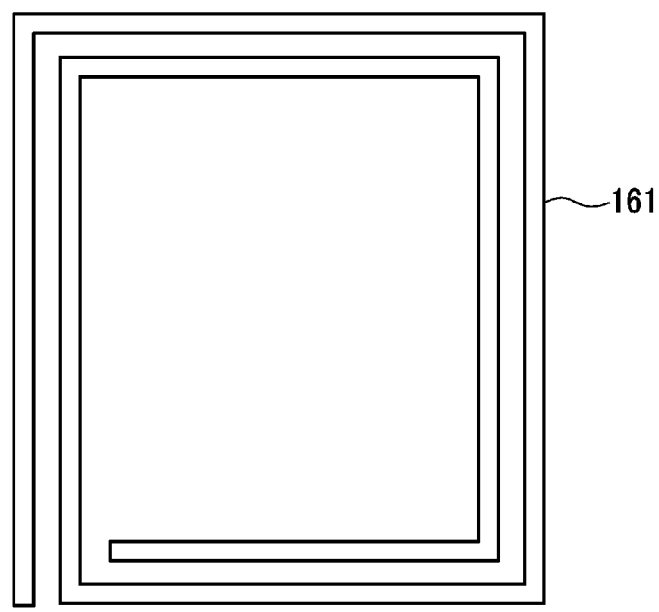
FIG. 30 is a plan view showing another example of the spiral planar antenna that constitutes the intermediate high-frequency antenna of FIG. 27, the inner high-frequency antenna of FIG. 27, and the inner high-frequency antenna of FIG. 26.

As the spiral planar antenna constituting the intermediate high-frequency antenna 132 of FIG. 27, the inner high-frequency antenna 133 of FIG. 27, and the inner high-frequency antenna 143 of FIG. 28, it may be possible to use a multiple (quadruple) antenna in which as shown in FIG. 29, four antenna wires 151, 152, 153, and 154 made of a conductive material such as copper or the like are wound so as to form a spiral shape as a whole. Furthermore, the spiral planar antenna may be an antenna in which as shown in FIG. 30, one antenna wire 161 is wound in a spiral shape.

Each annular antenna may be provided along the annular divided regions formed by the circumferential division which is the second division of the metal window 2 (or the annular regions demarcated by the slits). Thus, the interference between the eddy currents $I_{ED}$ generated in the annular divided regions (annular demarcated regions) of the metal window 2 under each annular antenna can be suppressed, and variations in the induced electric field generated inside the chamber 4 can be suppressed to improve the controllability of the plasma distribution. In this case, the width of each annular antenna may be smaller than that of the respective annular divided region (annular demarcated region) of the metal window 2. This makes it possible to further improve the controllability.

Example of Combination of Metal Window and High-Frequency Antenna

Next, some examples of a combination of the metal window and the high-frequency antenna will be described on a type-by-type basis.

Although all the following examples show the case where the metal window 2 is divided by predetermined dividing lines, the same effects can be obtained even when corresponding slits are formed instead of dividing the metal window 2.

[First Type]

A first type is an example where the antenna unit constitutes a multi-ring-shaped antenna and where a multi-segmented annular antenna, in which the number of window divisions is greater than or equal to the number of antenna divisions, is used as the outermost high-frequency antenna.

First Example of First Type

Figure 31:
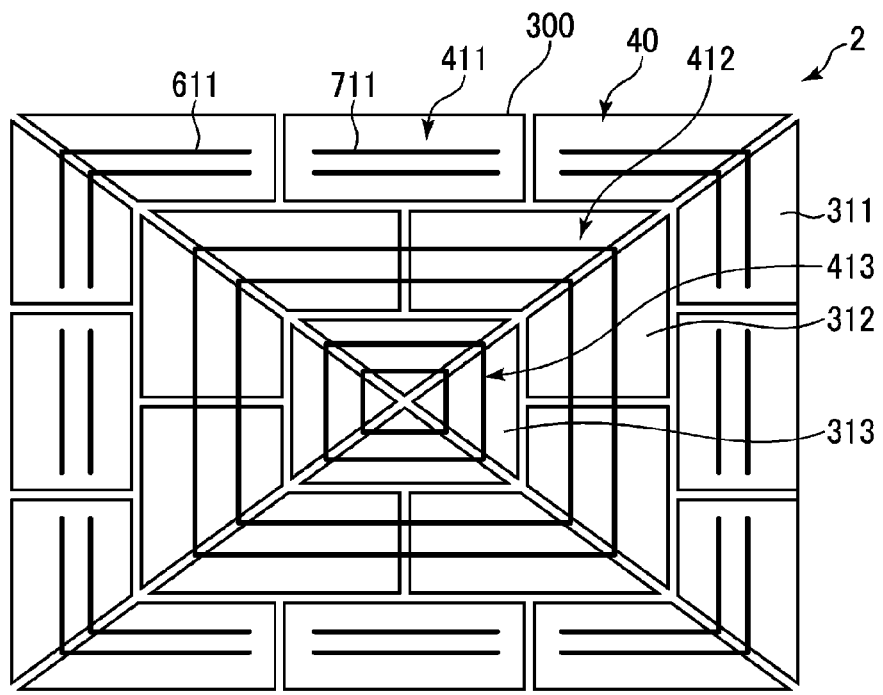
FIG. 31 is a plan view schematically showing a first example of a first type of a combination of the metal window and the high-frequency antenna.

FIG. 31 is a plan view schematically showing a first example of the first type. In this example, as the metal window 2, a metal window is used in which as shown in FIG. 7, the first division along the radial (diagonal) direction is performed, the second division along the circumferential direction is performed to make three divisions, and the third division along the direction orthogonal to the circumferential direction is performed. The metal window 2 is divided into three annular divided regions, i.e., an outer circumferential divided region 311, an intermediate circumferential divided region 312, and an inner circumferential divided region 313, along the circumferential direction by the second division. Further, the individual divided portions formed through the third division are all common divided portions 300 as in FIGS. 21 to 26 (the same holds true herein below).

The antenna unit 40 includes an outer high-frequency antenna 411, an intermediate high-frequency antenna 412, and an inner high-frequency antenna 413 that are annularly provided along the outer circumferential divided region 311, the intermediate circumferential divided region 312, and the inner circumferential divided region 313, respectively.

As with the high-frequency antenna 13, the outer high-frequency antenna 411 constitutes a multi-segmented annular antenna. The outer high-frequency antenna 411 includes four first antenna segments 611 constituting the corner portions and four second antenna segments 711 constituting the side portions. The first antenna segments 611 and the second antenna segments 711 are configured similarly to the first antenna segments 61 and the second antenna segments 71 of the high-frequency antenna 13. The second antenna segment 711 is provided so as to correspond to the divided portion 300 existing at the center of the side of the outer circumferential divided region 311. The first antenna segment 611 is provided so as to straddle the two divided portions 300 existing at the corner portions of the outer circumferential divided region 311.

The intermediate high-frequency antenna 412 and the inner high-frequency antenna 413 are formed of spiral planar antennas like the intermediate high-frequency antenna 132 and the inner high-frequency antenna 133.

With such a configuration, the currents at the corner portions and side portions of the outer peripheral region can be controlled independently, and uniform plasma can be formed by improving the controllability of plasma in the regions corresponding to the corner portions of the outer peripheral region and the regions corresponding to the side portions of the outer peripheral region inside the chamber 4, in which non-uniformity of plasma becomes a problem.

The outer high-frequency antenna 411, the intermediate high-frequency antenna 412, and the inner high-frequency antenna 413 are provided along the outer circumferential divided region 311, the intermediate circumferential divided region 312, and the inner circumferential divided region 313, respectively, so that the widths thereof become smaller than that of the divided regions. As a result, the interference between the eddy currents generated in the respective divided regions is suppressed, and the controllability of the plasma distribution is improved.

Furthermore, by providing partition plates (not shown) between the first antenna segments 611 and the second antenna segments 711 as described above, the interference between these antenna segments can be prevented, and the controllability of the currents can be improved to enhance the independent controllability of the induced electric fields by the antenna segment 400.

Second Example of First Type

Figure 32:
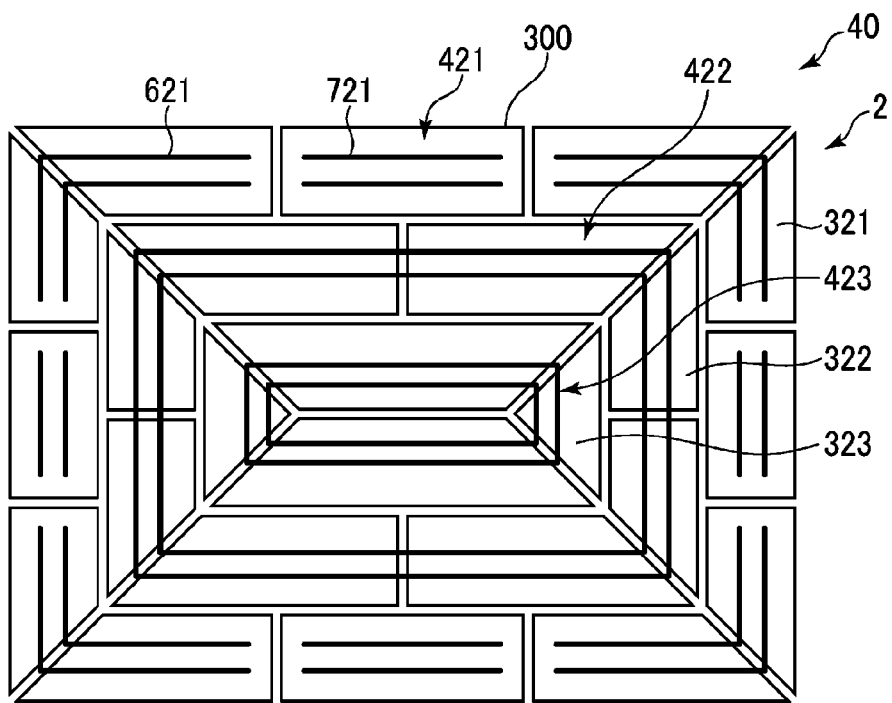
FIG. 32 is a plan view schematically showing a second example of the first type of the combination of the metal window and the high-frequency antenna.

FIG. 32 is a plan view schematically showing a second example of the first type. In this example, as the metal window 2, a metal window is used in which as shown in FIG. 8, the first division along the radial direction is performed so that the width becomes uniform between a divided portion including a long side and a divided portion including a short side, the second division along the circumferential direction is performed to make three divisions, and the third division along the direction orthogonal to the circumferential direction is performed. The metal window 2 is divided into three annular divided regions, i.e., an outer circumferential divided region 321, an intermediate circumferential divided region 322, and an inner circumferential divided region 323, along the circumferential direction by the second division.

The antenna unit 40 includes an outer high-frequency antenna 421, an intermediate high-frequency antenna 422, and an inner high-frequency antenna 423 annularly provided along the outer circumferential divided region 321, the intermediate circumferential divided region 322, and the inner circumferential divided region 323, respectively.

The outer high-frequency antenna 421 constitutes a multi-segmented annular antenna similar to the outer high-frequency antenna 411 of the first example. The outer high-frequency antenna 421 includes four first antenna segments 621 constituting corner portions and four second antenna segments 721 constituting side portions. These antenna segments 621 and 721 are configured in the same manner as the first antenna segment 611 and the second antenna segment 711 of the first example.

The intermediate high-frequency antenna 422 and the inner high-frequency antenna 423 are constituted as spiral planar antennas like the intermediate high-frequency antenna 412 and the inner high-frequency antenna 413 of the first example.

Also in this example, as in the first example, the currents at the corner portions and the side portions of the outer peripheral region can be independently controlled, and uniform plasma can be formed by improving the controllability of plasma in the regions corresponding to the corner portions of the outer peripheral region and the regions corresponding to the side portions of the outer peripheral region inside the chamber 4, in which non-uniformity of plasma becomes a problem. In addition, the same effects as those of the first example can be obtained.

Furthermore, in this example, the first division along the radial direction is performed so that the width becomes uniform between a divided portion including a long side and a divided portion including a short side. Therefore, the electric field intensities of the induced electric fields of the divided portions can be made uniform to further improve the uniformity of plasma.

Third Example of First Type

Figure 33:
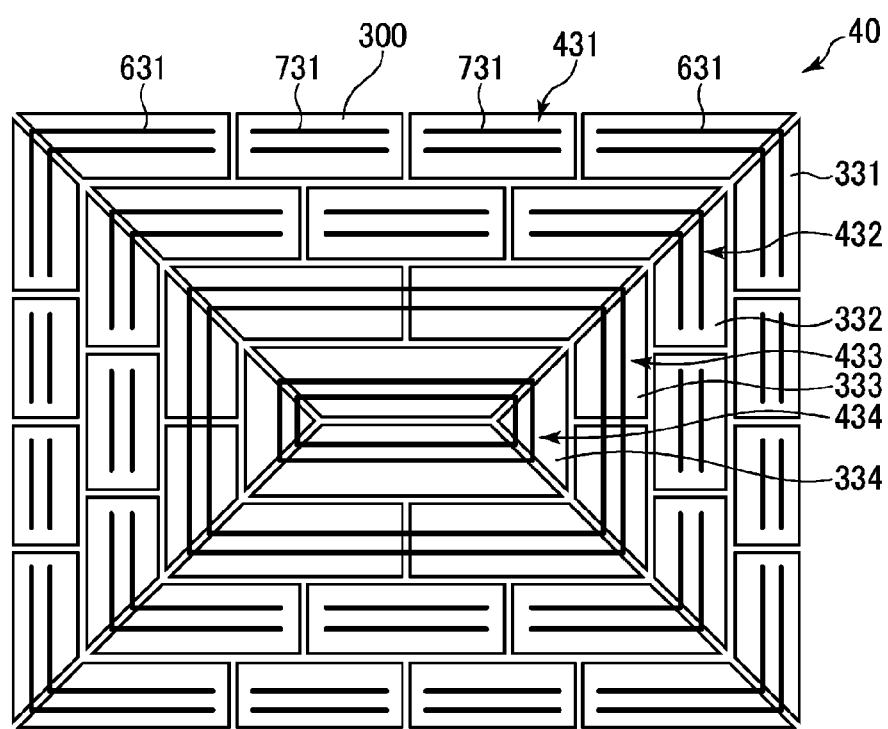
FIG. 33 is a plan view schematically showing a third example of the first type of the combination of the metal window and the high-frequency antenna.

FIG. 33 is a plan view schematically showing a third example of the first type. In this example, as the metal window 2, a metal window is used in which the first division along the radial direction is performed so that the width becomes uniform between a divided portion including a long side and a divided portion including a short side, the second division along the circumferential direction is performed to make three divisions, and the third division along the direction orthogonal to the circumferential direction is performed. The metal window 2 is divided into four annular divided regions, i.e., an outer circumferential divided region 331, a first intermediate circumferential divided region 332, a second intermediate circumferential divided region 333, and an inner circumferential divided region 334, along the circumferential direction by the second division. Furthermore, by the third division, each side of the outer circumferential divided region 331 is divided into four regions, each side of the first intermediate circumferential divided region 332 is divided into three regions, and each side of the second intermediate circumferential divided region 333 is divided into two regions.

The antenna unit 40 includes an outer high-frequency antenna 431, a first intermediate high-frequency antenna 432, a second intermediate high-frequency antenna 433, and an inner high-frequency antenna 434. The outer high-frequency antenna 431 is annularly provided along the outer circumferential divided region 331. The first intermediate high-frequency antenna 432 is annularly provided along the first intermediate circumferential divided region 332. The second intermediate high-frequency antenna 433 is annularly provided along the second intermediate circumferential divided region 333. The inner high-frequency antenna 434 is annularly provided along the inner circumferential divided region 334.

The outer high-frequency antenna 431 constitutes a multi-segmented annular antenna like the high-frequency antenna 13 described above. The outer high-frequency antenna 431 includes four first antenna segments 631 constituting corner portions and eight second antenna segments 731 constituting side portions. Two second antenna segments 731 are provided at each side. The first antenna segments 631 and the second antenna segments 731 are configured in the same manner as the first antenna segments 61 and the second antenna segments 71 of the high-frequency antenna 13. Each second antenna segment 731 is provided so as to correspond to one of the divided portions 300 of the side portions of the outer circumferential divided region 331. Furthermore, the first antenna segment 631 is provided so as to straddle the two divided portions 300 of the corner portions of the outer circumferential direction divided region 331.

The first intermediate high-frequency antenna 432, the second intermediate high-frequency antenna 433, and the inner high-frequency antenna 434 are configured as spiral planar antennas like the intermediate high-frequency antenna 132 and the inner high-frequency antenna 133.

With such a configuration, the currents at the corner portions and the side portions of the outer peripheral region can be independently controlled, and uniform plasma can be formed by improving the controllability of plasma in the regions corresponding to the corner portions of the outer peripheral region and the regions corresponding to the side portions of the outer peripheral region inside the chamber 4, in which non-uniformity of plasma becomes a problem. In addition, the same effects as those of the second example can be obtained. In this example, inductively-coupled plasma processing can be uniformly performed with good controllability on a larger substrate than the substrate applicable in the first and second examples.

Fourth Example of First Type

Figure 34:
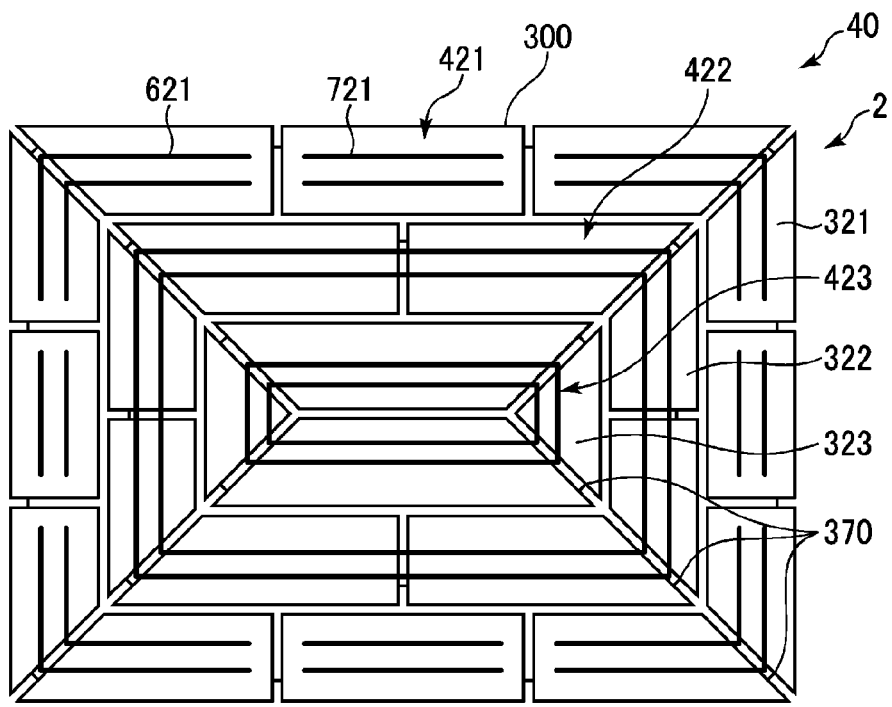
FIG. 34 is a plan view schematically showing a fourth example of the first type of the combination of the metal window and the high-frequency antenna.

FIG. 34 is a plan view schematically showing a fourth example of the first type. In this example, as the metal window 2, a metal window is used in which as shown in FIG. 16, the first division along the radial direction is performed so that the width becomes uniform between a divided portion including a long side and a divided portion including a short side, the second division along the circumferential direction is performed to make three divisions, the third division along the direction orthogonal to the circumferential direction is performed, and the respective divided portions are connected to each other in the circumferential direction by conductive connecting members. The metal window 2 is divided into three annular divided regions, i.e., an outer circumferential divided region 321, an intermediate circumferential divided region 322, and an inner circumferential divided region 323, along the circumferential direction by the second division. The arrangement of the antenna unit is the same as that in the second example. Even in this example, the currents at the corner portions and the side portions of the outer peripheral region can be independently controlled. Therefore, uniform plasma can be formed by improving the plasma controllability in the regions corresponding to the corner portions of the outer peripheral region and the regions corresponding to the side portions of the outer peripheral region inside the chamber 4, in which non-uniformity of plasma becomes a problem. The plasma density distribution can be reinforced between the divided portions. Moreover, the controllability of the plasma distribution can be further improved by installing capacitive elements in one or more conductive connecting members. In addition, the same effects as those of the first example and the second example can be obtained. In this example, the first division along the radial direction is performed so that the width can be made uniform between the divided portion including the long side and the divided portion including the short side. Therefore, the electric field intensities of the induced electric fields of the divided portions can be made uniform to further improve the uniformity of plasma.

[Second Type]

A second type is an example where the antenna unit constitutes a multi-ring-shaped antenna and where a multi-segmented annular antenna, in which the number of window divisions is less than the number of antenna divisions, is used as the outermost high-frequency antenna.

First Example of Second Type

Figure 35:
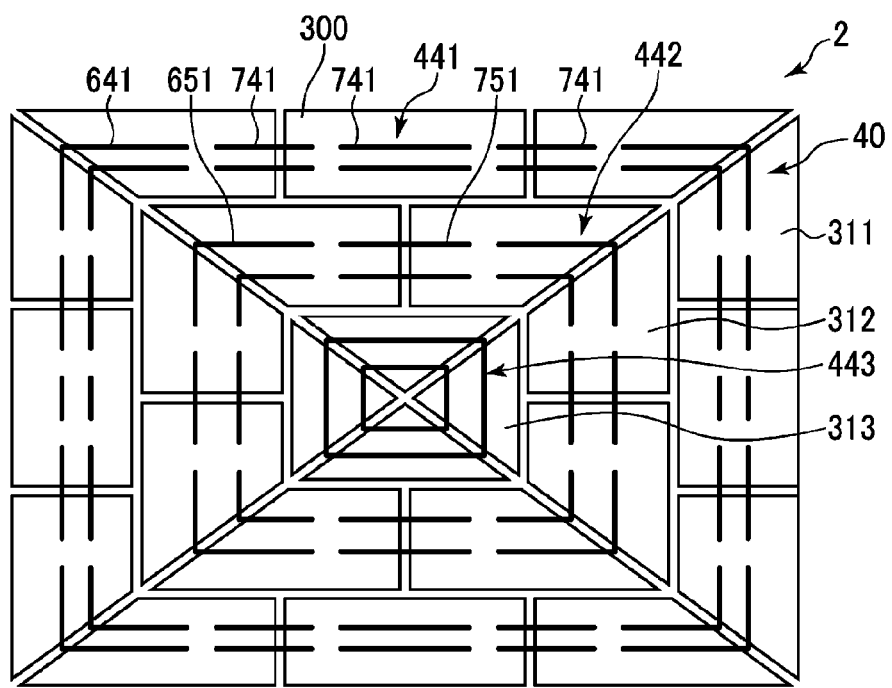
FIG. 35 is a plan view schematically showing a first example of a second type of the combination of the metal window and the high-frequency antenna.

FIG. 35 is a plan view schematically showing a first example of the second type. In this example, as the metal window 2, a metal window is used in which, as in the first example of first type shown in FIG. 31, the first division along the radial (diagonal) direction is performed, the second division along the circumferential direction is performed to make three divisions, and the third division along the direction orthogonal to the circumferential direction is performed. As shown in FIG. 31, the metal window 2 is divided into three annular divided regions, i.e., an outer circumferential divided region 311, an intermediate circumferential divided region 312, and an inner circumferential divided region 313, along the circumferential direction by the second division.

The antenna unit 40 includes an outer high-frequency antenna 441, an intermediate high-frequency antenna 442, and an inner high-frequency antenna 443 annularly provided along the outer circumferential divided region 311, the intermediate circumferential divided region 312, and the inner circumferential divided region 313, respectively.

As with the high-frequency antenna 13, the outer high-frequency antenna 441 constitutes a multi-segmented annular antenna. The outer high-frequency antenna 441 includes four first antenna segments 641 constituting the corner portions and twelve second antenna segments 741 constituting the side portions. Three second antenna segments 741 are provided at each side. The first antenna segments 641 and the second antenna segments 741 are configured similarly to the first antenna segments 61 and the second antenna segments 71 of the high-frequency antenna 13 described above. The second antenna segment 741 is provided so as to straddle the adjacent divided portions 300. Three second antenna segments 741 correspond to the divided portion 300 existing at the center of the side of the outer circumferential divided region 311. In addition, the first antenna segment 641 and the two second antenna segments 741 correspond to the divided portion 300 existing at the corner portion of the outer circumferential divided region 311. That is, the number of antenna divisions (the number of antenna segments) is larger than the number of divisions of the outer circumferential divided region 311 by the third division. Further, the second antenna segment 741 does not necessarily have to be provided so as to straddle the adjacent divided portions 300. It is only necessary that a plurality of second antenna segments 741 corresponds to one divided portion 300.

Similarly, the intermediate high-frequency antenna 442 constitutes a multi-segmented annular antenna. The intermediate high-frequency antenna 442 includes four first antenna segments 651 constituting the corner portions and four second antenna segments 751 constituting the side portions. The first antenna segments 651 and the second antenna segments 751 are configured similarly to the first antenna segments 61 and the second antenna segments 71 of the high-frequency antenna 13. The intermediate circumferential divided region 312 of the metal window 2 includes two divided portions 300 at each side, and the second antenna segment 751 is provided so as to straddle the two divided portions 300 existing at each side. Furthermore, the first antenna segment 651 is provided so as to straddle the adjacent divided portions 300 of the metal window 2 at the corner portion. That is, in the intermediate circumferential divided region 312, a plurality of antenna segments corresponds to one divided portion 300. However, the number of divisions by the third division is equal to the number of antenna divisions (the number of antenna segments).

The inner high-frequency antenna 443 is formed of a spiral planar antenna like the intermediate high-frequency antenna 132 and the inner high-frequency antenna 133.

As described above, the outer high-frequency antenna 441 is formed of a multi-segmented annular antenna. Therefore, the currents at the corner portions and the side portions of the outer peripheral region can be independently controlled in the outer circumferential divided region 311 of the metal window 2. For this reason, uniform plasma can be formed by improving the controllability of plasma in the regions corresponding to the corner portions of the outer peripheral region and the regions corresponding to the side portions of the outer peripheral region inside the chamber 4, in which non-uniformity of plasma becomes a problem. Furthermore, since the number of divisions of the outer high-frequency antenna 441 is larger than the number of divisions of the outer circumferential divided region 311 of the metal window 2, a plurality of antenna segments is arranged for one divided portion 300. Thus, the eddy current spreads along a plane, and as described above, it is possible to further enhance the controllability of the induced electric field formed inside the chamber 4 and hence the controllability of plasma.

Furthermore, the intermediate high-frequency antenna 442 is also formed of a multi-segmented annular antenna. Therefore, the currents at the corner portions and the side portions of the outer peripheral region can be independently controlled even in the intermediate circumferential divided region 312 of the metal window 2. For this reason, the controllability of plasma can be further improved, and the uniformity of plasma can be further improved. In the intermediate circumferential divided region 312, the number of divisions of the intermediate high-frequency antenna 442 is equal to the number of divisions of the intermediate circumferential divided region 312 of the metal window 2. However, the antenna segments are arranged so as to deviate from the divided portions 300 of the metal window 2. As a result, a plurality of antenna segments is arranged in one divided portion 300 and the eddy current spreads along a plane, so that the controllability of plasma in the region corresponding to the intermediate circumferential divided region 312 inside the chamber 4 can be enhanced. In addition, the same effects as those of the first example of the first type can be obtained.

Second Example of Second Type

Figure 36:
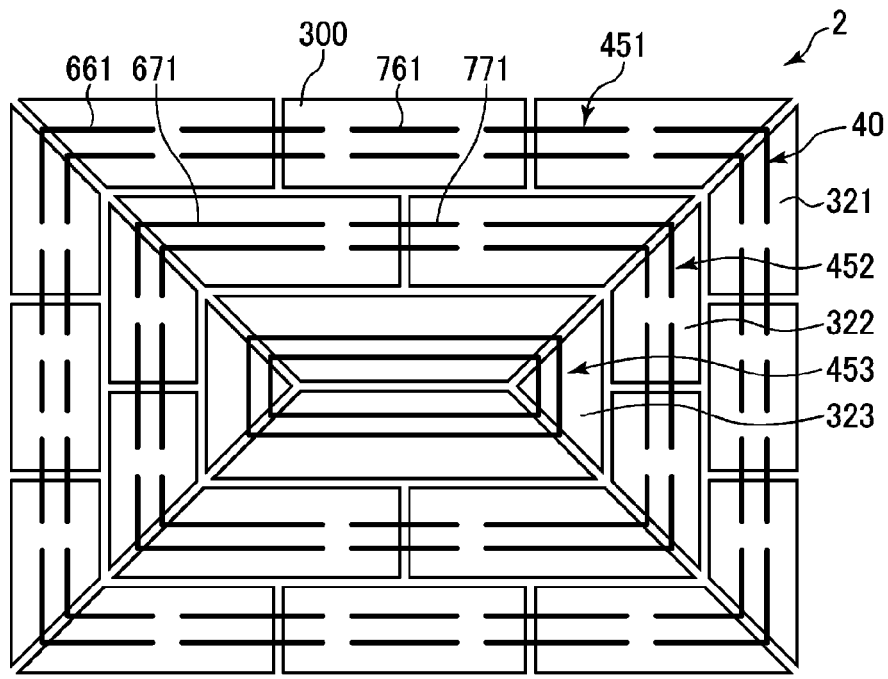
FIG. 36 is a plan view schematically showing a second example of the second type of the combination of the metal window and the high-frequency antenna.

FIG. 36 is a plan view schematically showing a second example of the second type. In this example, as the metal window 2, a metal window is used in which, as in the second example of the first type shown in FIG. 32, the first division along the radial direction is performed so that the width becomes uniform between a divided portion including a long side and a divided portion including a short side, the second division along the circumferential direction is performed to make three divisions, and the third division along the direction orthogonal to the circumferential direction is performed. As shown in FIG. 32, the metal window 2 is divided into three annular divided regions, i.e., an outer circumferential divided region 321, an intermediate circumferential divided region 322, and an inner circumferential divided region 323, along the circumferential direction by the second division.

The antenna unit 40 includes an outer high-frequency antenna 451, an intermediate high-frequency antenna 452, and an inner high-frequency antenna 453 annularly provided along the outer circumferential divided region 321, the intermediate circumferential divided region 322, and the inner circumferential divided region 323, respectively.

The outer high-frequency antenna 451 constitutes a multi-segmented annular antenna similar to the outer high-frequency antenna 441 of the first example. The outer high-frequency antenna 451 includes four first antenna segments 661 constituting corner portions and twelve second antenna segments 761 constituting side portions. These antenna segments 661 and 761 are configured in the same manner as the first antenna segments 641 and the second antenna segments 741 of the first example.

Similarly, the intermediate high-frequency antenna 452 also constitutes a multi-segmented annular antenna. The intermediate high-frequency antenna 452 includes four first antenna segments 671 constituting corner portions and four second antenna segments 771 constituting side portions. These antenna segments 671 and 771 are configured similarly to the first antenna segments 651 and the second antenna segments 751 of the first example.

The inner high-frequency antenna 453 is formed as a spiral planar antenna like the inner high-frequency antenna 443 of the first example.

Also in this example, basically, the same effects as those of the first example can be obtained. Furthermore, in this example, the first division along the radial direction is performed so that the width can be made uniform between the divided portion including the long side and the divided portion including the short side. Therefore, the electric field intensities of the induced electric fields of the divided portions can be made uniform to further improve the uniformity of plasma.

Third Example of Second Type

Figure 37:
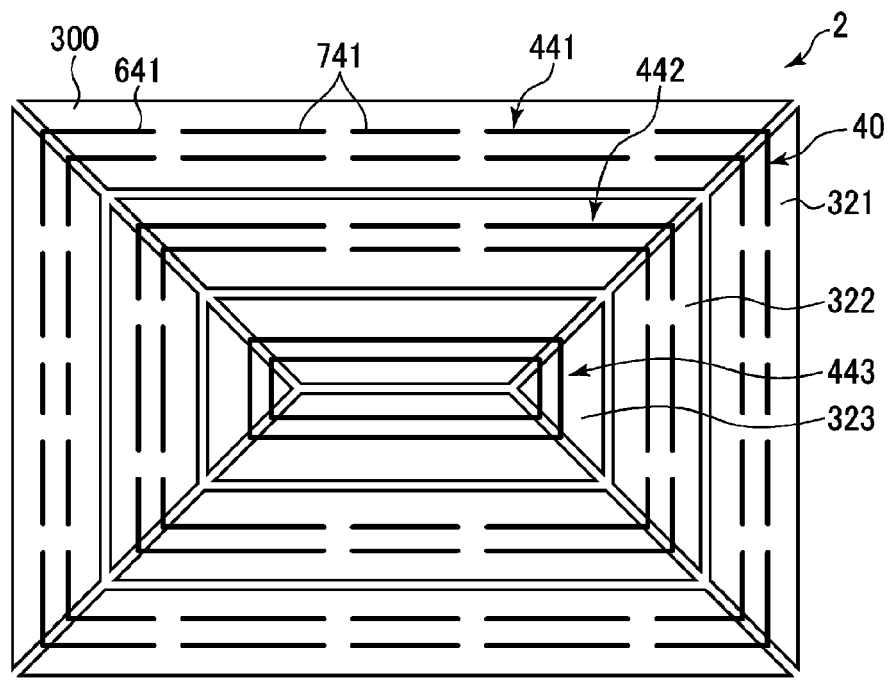
FIG. 37 is a plan view schematically showing a third example of the second type of the combination of the metal window and the high-frequency antenna.

FIG. 37 is a plan view schematically showing a third example of the second type. In this example, as the metal window 2, a metal window is used in which the first division and the second division are performed as in the second example shown in FIG. 36 and the third division is not performed. As shown in FIG. 36, the metal window 2 is divided into three annular divided regions, i.e., an outer circumferential divided region 321, an intermediate circumferential divided region 322, and an inner circumferential divided region 323, along the circumferential direction by the second division. The divided portion 300 corresponds to one side of the metal window 2.

The antenna unit 40 uses an antenna unit similar to one shown in FIG. 36 that includes an outer high-frequency antenna 441, an intermediate high-frequency antenna 442, and an inner high-frequency antenna 443.

As described above, even if the metal window 2 is not subjected to the third division so that each of the outer circumferential divided region 321, the intermediate circumferential divided region 322, and the inner circumferential divided region 323 has one side, the same effects can be obtained because the antenna unit 40 is the same as that of the second example. That is, by using the multi-segmented annular antennas as the outer high-frequency antenna 441 and the intermediate high-frequency antenna 442, as in the second example, the currents at the corner portions and the side portions of the outer peripheral region can be controlled independently in the outer circumferential divided region 321 and the intermediate circumferential divided region 322 of the metal window 2. Therefore, the controllability of plasma in the regions corresponding to the corner portions and the regions corresponding to the side portions of the outer circumferential divided region 321 and the intermediate circumferential divided region 322 inside the chamber 4 can be improved to form uniform plasma.

Fourth Example of Second Type

Figure 38:
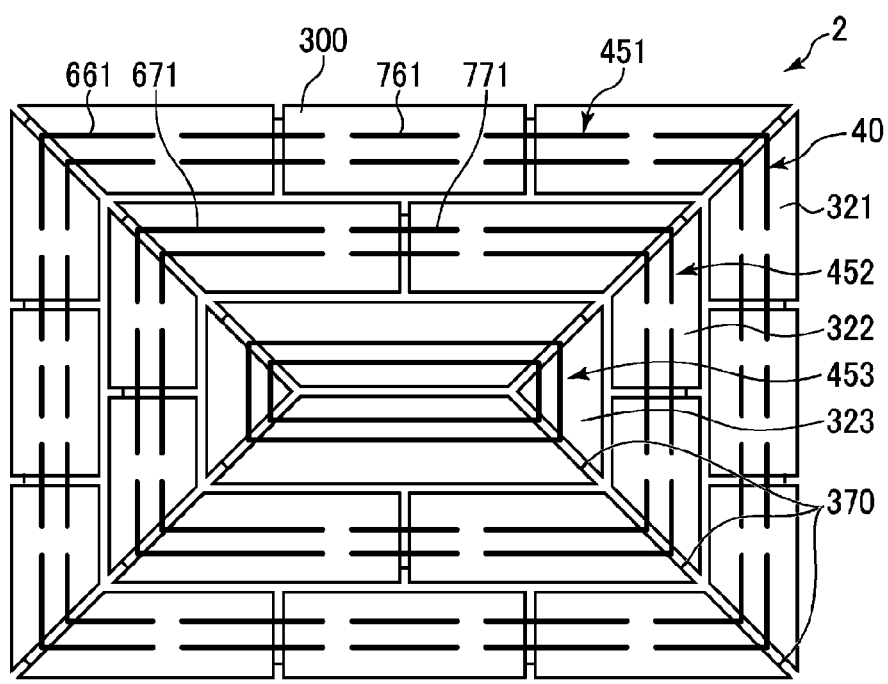
FIG. 38 is a plan view schematically showing a fourth example of the second type of the combination of the metal window and the high-frequency antenna.

FIG. 38 is a plan view schematically showing a fourth example of the second type. In this example, as the metal window 2, a metal window is used in which, as in the fourth example of the first type, the first division along the radial direction is performed so that the width becomes uniform between a divided portion including a long side and a divided portion including a short side, the second division along the circumferential direction is performed to make three divisions, the third division along the direction orthogonal to the circumferential direction is performed, and the respective divided portions are connected to each other in the circumferential direction by conductive connecting members. The metal window 2 is divided into three annular divided regions, i.e., an outer circumferential divided region 321, an intermediate circumferential divided region 322, and an inner circumferential divided region 323, along the circumferential direction by the second division. The arrangement of the antenna unit is the same as that in the second example of the second type. Even in this example, the same effects as those of the second example can be obtained, and the plasma density distribution can be reinforced between the divided portions. Moreover, the controllability of the plasma distribution can be further improved by installing capacitive elements in one or more conductive connecting members. In addition, the same effects as those of the first example and the second example can be obtained. In this example, the first division along the radial direction is performed so that the width can be made uniform between the divided portion including the long side and the divided portion including the short side. Therefore, the electric field intensities of the induced electric fields of the divided portions can be made uniform to further improve the uniformity of plasma.

<Operation of Inductively-Coupled Plasma Processing Apparatus>

Next, a processing operation when performing plasma processing, for example, plasma etching, on the substrate G using the inductively-coupled plasma processing apparatus configured as described above will be described.

First, the substrate G is loaded into the chamber 4 from the loading/unloading port 27a by the transfer mechanism (not shown) in the state where the gate valve 27 is opened. The substrate G is mounted on the mounting surface of the mounting table 23 and is then fixed onto the mounting table 23 by an electrostatic chuck (not shown). Next, the processing gas supplied from the processing gas supply mechanism 20 into the chamber 4 is discharged into the chamber 4 from the gas diffusion space 51 of each divided portion 50 of the metal window 2 through the gas discharge holes 54 of the shower plate 53. The interior of the chamber 4 is evacuated by the exhaust device 30 through the exhaust pipe 31 to maintain the interior of the processing chamber in a pressure atmosphere of, for example, about 0.66 to 26.6 Pa.

Further, at this time, the He gas as a heat transfer gas is supplied into the cooling space defined at the side of the back surface of the substrate G through the He gas flow path 32 in order to suppress the temperature increase or the temperature change of the substrate G and to appropriately adjust the temperature.

Subsequently, a high frequency of 400 kHz to 27.12 MHz, for example, 13.56 MHz, is applied to the high-frequency antenna 13 from the first high-frequency power supply 18, thereby generating a uniform induced electric field inside the chamber 4 through the metal window 2. By virtue of the induced electric field generated in this manner, the processing gas is turned into plasma inside the chamber 4, whereby high-density inductively-coupled plasma is generated. By this plasma, for example, plasma etching as plasma processing is performed on the substrate G. At this time, biasing high-frequency power is applied from the second high-frequency power supply 29 to the mounting table 23. Ions in the plasma generated inside the chamber 4 are effectively drawn into the substrate G by the self-bias generated in this manner The metal window 2 is used in such plasma processing. The metal window 2 is easier to process than a dielectric window and is suitable for a substrate having an increased size. Since the metal window 2 is easy to process, it can be formed into a showerhead structure, thereby facilitating the supply of a gas. Furthermore, the use of the metal window has an advantage that the temperature controllability is improved as compared with a dielectric window.

In Patent Documents 1 and 2 described above, an inductively-coupled plasma processing apparatus using such a metal window is proposed. However, it is desirable to further improve the plasma controllability.

Therefore, in one embodiment, the antenna unit 40 is used which includes the high-frequency antenna 13 in which a plurality of antenna segments having planar portions formed to face the upper surface of the metal window 2 are arranged in an annular shape so that the planar portions as a whole form the rectangular frame-shaped region 81 for generating an induced electric field that contributes to plasma generation. Specifically, the antenna segment is configured by spirally winding the antenna wire in the vertical direction orthogonal to the upper surface of the metal window 2 so that the winding axis is parallel to the metal window 2. Current control is performed independently for each antenna segment. Thus, the plasma density distribution can be finely controlled by controlling the induced electric field in the plasma control area corresponding to each antenna segment. In particular, the currents at the corner portions and the side portions can be controlled independently, and the controllability of plasma in the regions corresponding to the corner portions and the region corresponding to the side portions inside the chamber 4 can be improved to form uniform plasma.

Such use of a plurality of antenna segments is disclosed in Japanese Patent Application Publication No. 2013-162035. However, the publication is mainly directed to an inductively-coupled plasma processing apparatus using a dielectric window, which differs in plasma generation mechanism from the case of using a metal window.

In one embodiment, it is apparent that even in the inductively-coupled plasma processing apparatus using the metal window, the plasma density distribution can be finely controlled by appropriately dividing the metal window and controlling the induced electric field in the plasma control area corresponding to each antenna segment by the multi-segmented annular antenna using a plurality of antenna segments. That is, by performing the first division along the radial (diagonal) direction (the first demarcation using radial slits) toward each corner of the rectangular metal window 2 and using the multi-segmented annular antenna, it is possible to control the induced electric field in the plasma control area and to finely control the plasma density distribution.

Furthermore, in addition to the first division along the radial direction, the second division along the circumferential direction (the second demarcation) is performed on the metal window 2. Therefore, the controllability of plasma can be further improved by the effect of suppressing diffusion of the looping eddy current $I_{ED}$ by the circumferential division and the synergistic effect of using the multi-segmented annular antenna.

Furthermore, in addition to the first division and the second division, the metal window 2 is subjected to the third division along the direction orthogonal to the circumferential direction. Therefore, it is possible to further reduce the vertical electric field $E_V$ from the plasma toward the metal window 2 and to reduce the damage to the metal window 2. Moreover, the high-frequency antenna is divided so that two or more antenna segments correspond to the divided portions of the metal window divided by the third division. Therefore, it is possible to form planar spread of looping eddy currents and to further improve the controllability of plasma.

Furthermore, the partition plates 500 insulated from the metal window 2 are provided between the antenna segments of the multi-segmented annular antenna. Therefore, it is possible to prevent the interference of the induced electric fields between the adjacent antenna segments and to improve the controllability of currents in the antenna segments. Thus, the independent controllability of the induced electric fields by the antenna segments 400 can be improved.

Instead of dividing the metal window 2, the slits corresponding to the various divisions as described above are provided without dividing the metal window 2 while maintaining the metal window 2 as one piece. Thus, it is possible to obtain the same effects as in the case of dividing the metal window 2.

<Verification Experiment>

Next, a verification experiment will be described.

Figure 39:
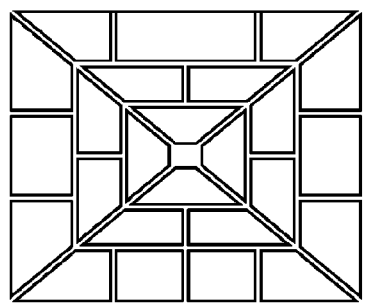
FIG. 39 is a view showing division forms of the metal window used in a verification experiment.
Figure 39:
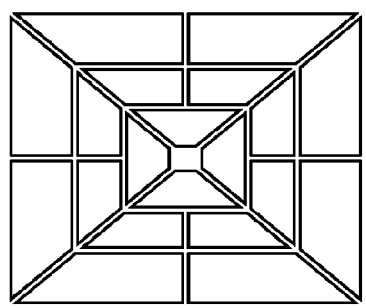
Figure 39:
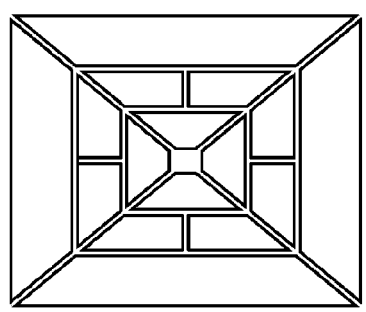

In this experiment, as shown in FIG. 39, three types of metal windows divided into 24 divisions, 20 divisions, and 16 divisions (the outer sides being integral) were used. As the antenna unit, an antenna unit was used which includes an outer high-frequency antenna as a multi-segmented annular antenna, an intermediate high-frequency antenna as a spiral planar antenna, and an inner high-frequency antenna as a spiral planar antenna as shown in FIG. 31. Inductively-coupled plasma processing was performed on a substrate having a short side of 150 cm and a long side of 185 cm under the conditions of a pressure of 15 mTorr and a plasma-generating high-frequency power of 15 kW using an $O_2$ gas as a processing gas.

Figure 40:
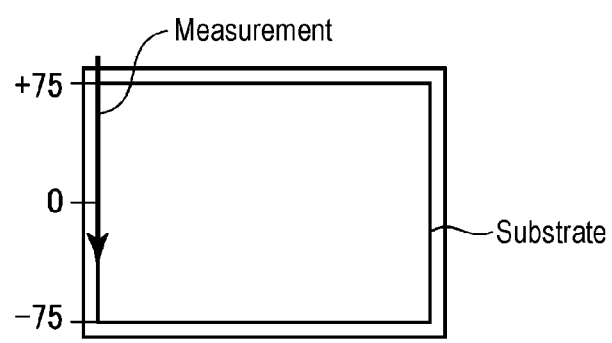
FIG. 40 is a view for explaining the locations where a plasma density is measured in the verification experiment.
Figure 41:
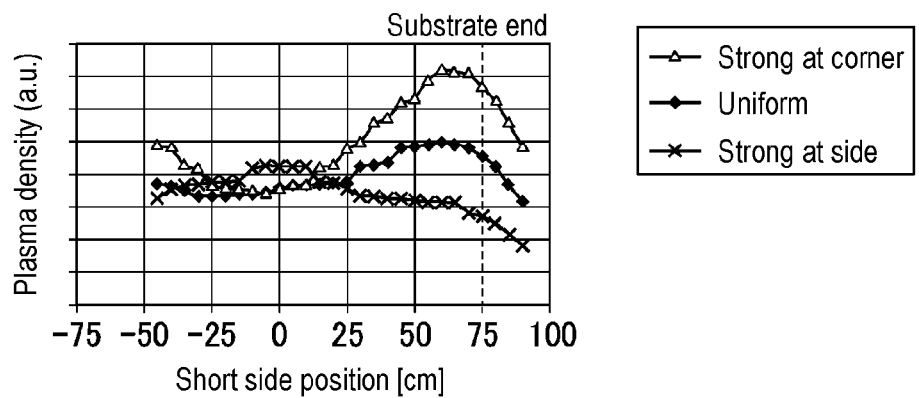
FIG. 41 is a view showing a plasma density distribution when a 24-divided metal window shown in FIG. 39 is used.
Figure 42:
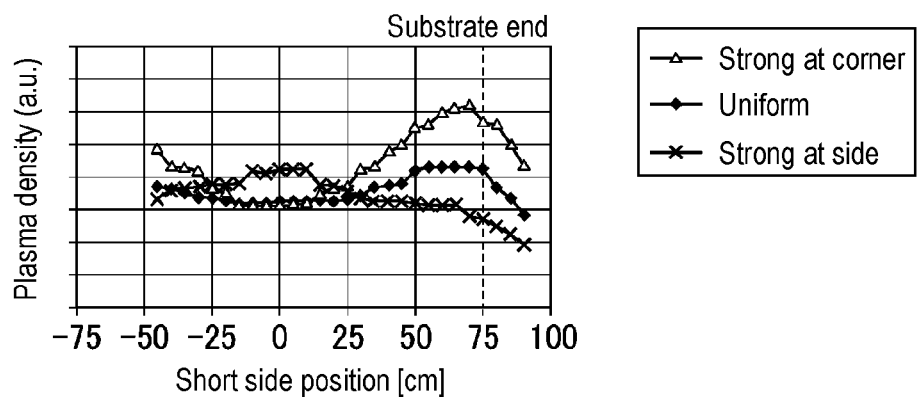
FIG. 42 is a view showing a plasma density distribution when a 20-divided metal window shown in FIG. 39 is used.
Figure 43:
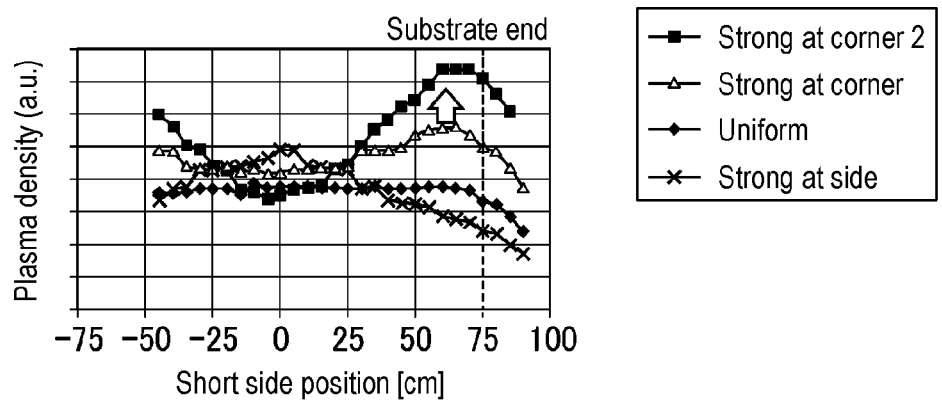
FIG. 43 is a view showing a plasma density distribution when a 16-divided metal window shown in FIG. 39 is used.

The plasma generated at that time was visually observed, and the plasma density at a point 40 mm above the short-side edge of the substrate as shown in FIG. 40 was measured by a plasma absorption probe method. The results are shown in FIGS. 41 to 43.

From these figures, it was confirmed that the plasma density distribution can be controlled regardless of the division form of the metal window by controlling the current values at the antenna segments of the corner portions and the side portions. Furthermore, it was confirmed that in the 16 divisions, if the currents of the antenna segments are controlled so that the plasma at the corner portions become visually strong, the plasma density at the corner portions are lower than that of other metal windows, but the plasma density at the corner portions can be increased by further increasing the current at the corner portions (strong at corner 2).

<Other Applications>

Although the embodiment has been described above, the embodiment disclosed herein should be considered as illustrative and not restrictive in all respects. The above-described embodiment may be omitted, replaced and modified in various forms without departing from the scope and spirit of the appended claims.

For example, in the above-described embodiments, there has been described an example in which current control in the antenna segments of the multi-segmented annular antenna is performed by adjusting the impedance using variable capacitors as impedance adjustment parts. However, other impedance adjustment parts such as variable coils and the like may be used. In addition, a current may be distributed to the antenna segments using a power splitter, or a high-frequency power supply may be used for each antenna segment.

Moreover, although etching or ashing is illustrated as plasma processing in the above-described embodiments, the present disclosure may be applied to other plasma processing such as CVD-based film formation and the like. Furthermore, although there has been described an example in which a glass substrate for FPD is applied as a rectangular substrate, other substrates such as a ceramic substrate and the like may be used.

According to the present disclosure in some embodiments, it is possible to provide an inductively-coupled plasma processing apparatus capable of performing plasma processing with higher plasma controllability and higher uniformity by inductively-coupled plasma using a metal window.

What is claimed is:

1. An inductively-coupled plasma processing apparatus for performing an inductively-coupled plasma processing on a rectangular substrate, comprising:

a processing container;

a mounting table provided inside the processing container and configured to mount the rectangular substrate thereon;

a rectangular metal window constituting a top wall of the processing container and provided to be electrically insulated from the processing container while facing the mounting table;

an antenna compartment provided above the rectangular metal window; and a first high-frequency antenna provided in the antenna compartment and configured to generate an inductively-coupled plasma inside the processing container, wherein the rectangular metal window is divided into divided regions electrically insulated from each other by a first division extending in a radial direction toward each of corner portions of the rectangular metal window, wherein the first high-frequency antenna is further configured as a multi-segmented annular antenna in which a plurality of antenna segments having planar portions facing an upper surface of the rectangular metal window is arranged so that the planar portions form a rectangular frame-shaped region as a whole, wherein each of the plurality of antenna segments is configured by spirally winding an antenna wire in a vertical direction orthogonal to the upper surface of the rectangular metal window so that a winding axis is parallel to the upper surface of the rectangular metal window, wherein the plurality of antenna segments are separated from each other by partition plates electrically insulated from the rectangular metal window, wherein each of the partition plates has a lower end that directly faces the rectangular metal window with a gap formed between the lower end and the rectangular metal window, and wherein a current supplied to each of the plurality of antenna segments is controllable.

2. The apparatus of claim 1, wherein the rectangular metal window is divided into a plurality of annular divided regions electrically insulated from each other by a second division extending in a circumferential direction, and wherein the first high-frequency antenna is provided so as to correspond to one of the plurality of annular divided regions.

3. The apparatus of claim 2, further comprising at least one second high-frequency antenna provided in the antenna compartment and having an annular shape, the at least one second high-frequency antenna being provided so as to correspond to an annular divided region, among the plurality of annular divided regions, that does not correspond to the first high-frequency antenna.

4. The apparatus of claim 3, wherein the plurality of annular divided regions include three or more annular divided regions, and the first high-frequency antenna is provided so as to correspond to an outer annular divided region, among the plurality of annular divided regions, that is provided on an outermost periphery.

5. The apparatus of claim 4, wherein the at least one second high-frequency antenna is a multi-segmented annular antenna or a planar annular antenna.

6. The apparatus of claim 5, wherein the at least one second high-frequency antenna constituting the multi-segmented annular antenna is provided so as to correspond to an intermediate annular divided region located adjacently inward of the outer annular divided region among the plurality of annular divided regions.

7. The apparatus of claim 6, wherein a width of each of the plurality of annular divided regions is larger than that of the first high-frequency antenna or the at least one second high-frequency antenna corresponding thereto.

8. The apparatus of claim 7, wherein a portion corresponding to each side of the plurality of annular divided regions in the rectangular metal window is divided into a plurality of divided portions electrically insulated from each other by a third division extending in a direction orthogonal to the circumferential direction of the second division.

9. The apparatus of claim 8, wherein the plurality of divided portions formed by the third division correspond to only one of the plurality of antenna segments.

10. The apparatus of claim 8, wherein at least some of the plurality of divided portions formed by the third division correspond to two or more of the plurality of antenna segments, respectively.

11. The apparatus of claim 3, wherein a width of each of the plurality of annular divided regions is larger than that of the first high-frequency antenna or the at least one second high-frequency antenna corresponding thereto.

12. The apparatus of claim 2, wherein a portion corresponding to each side of the plurality of annular divided regions in the rectangular metal window is divided into a plurality of divided portions electrically insulated from each other by a third division extending in a direction orthogonal to the circumferential direction of the second division.

* * * * *